United States Patent
Cheng et al.

(10) Patent No.: US 10,519,032 B2
(45) Date of Patent: Dec. 31, 2019

(54) MEMS PRESSURE SENSOR AND MICROPHONE DEVICES HAVING THROUGH-VIAS AND METHODS OF FORMING SAME

(71) Applicant: Taiwan Semiconductor Manufacturing Company, Ltd., Hsinchu (TW)

(72) Inventors: Chun-Wen Cheng, Zhubei (TW); Chia-Hua Chu, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 16/023,631

(22) Filed: Jun. 29, 2018

(65) Prior Publication Data

US 2018/0327254 A1 Nov. 15, 2018

Related U.S. Application Data

(62) Division of application No. 15/265,434, filed on Sep. 14, 2016, now Pat. No. 10,017,378, which is a
(Continued)

(51) Int. Cl.
*B81C 1/00* (2006.01)
*B81B 7/00* (2006.01)

(52) U.S. Cl.
CPC .......... *B81B 7/007* (2013.01); *B81C 1/00238* (2013.01); *B81C 1/00301* (2013.01);
(Continued)

(58) Field of Classification Search
CPC ... H01L 2924/1461; H01L 2224/7592–75925; H01L 29/84;
(Continued)

(56) References Cited

U.S. PATENT DOCUMENTS

| 8,216,882 B2 | 7/2012 | Lin et al. |
| 8,350,346 B1 | 1/2013 | Huang et al. |

(Continued)

FOREIGN PATENT DOCUMENTS

| TW | 201242382 A | 10/2012 |
| WO | 2012122872 A1 | 9/2012 |

*Primary Examiner* — Cuong B Nguyen
(74) *Attorney, Agent, or Firm* — Slater Matsil, LLP

(57) ABSTRACT

A method embodiment includes providing a MEMS wafer. A portion of the MEMS wafer is patterned to provide a first membrane for a microphone device and a second membrane for a pressure sensor device. A carrier wafer is bonded to the MEMS wafer. The carrier wafer is etched to expose the first membrane and a first surface of the second membrane to an ambient environment. A MEMS structure is formed in the MEMS wafer. A cap wafer is bonded to a side of the MEMS wafer opposing the carrier wafer to form a first sealed cavity including the MEMS structure and a second sealed cavity including a second surface of the second membrane for the pressure sensor device. The cap wafer comprises an interconnect structure. A through-via electrically connected to the interconnect structure is formed in the cap wafer.

20 Claims, 32 Drawing Sheets

Related U.S. Application Data division of application No. 13/955,957, filed on Jul. 31, 2013, now Pat. No. 9,469,527.

(60) Provisional application No. 61/783,475, filed on Mar. 14, 2013.

(52) U.S. Cl.
CPC ............. *B81B 2201/0257* (2013.01); *B81B 2201/0264* (2013.01); *B81C 2201/019* (2013.01); *B81C 2203/0792* (2013.01)

(58) Field of Classification Search
CPC ... H01L 41/1132–125; B81C 2201/019; B81C 1/00238; B81C 1/00; B81C 2203/0792; B81C 1/00158; B81C 1/00301; B81B 3/0018; B81B 7/007; B81B 2201/0257; B81B 2201/0264
See application file for complete search history.

(56) References Cited

U.S. PATENT DOCUMENTS

| | | |
|---|---|---|
| 8,513,747 B1 | 8/2013 | Huang et al. |
| 8,524,519 B2 | 9/2013 | Wang et al. |
| 8,802,473 B1 | 8/2014 | Chu et al. |
| 8,890,191 B2 | 11/2014 | Shiu et al. |
| 9,040,334 B2 | 5/2015 | Chu et al. |
| 9,085,455 B2 | 7/2015 | Cheng et al. |
| 9,187,317 B2 | 11/2015 | Cheng et al. |
| 9,260,295 B2 | 2/2016 | Chu et al. |
| 9,260,296 B2 | 2/2016 | Chu et al. |
| 2005/0037534 A1 | 2/2005 | Sawyer |
| 2005/0176179 A1 | 8/2005 | Ikushima et al. |
| 2006/0016486 A1 | 1/2006 | Teach et al. |
| 2007/0099395 A1 | 5/2007 | Sridhar et al. |
| 2007/0231943 A1 | 10/2007 | Ouellet et al. |
| 2008/0192963 A1 | 8/2008 | Sato |
| 2011/0012248 A1* | 1/2011 | Reichenbach ...... B81C 1/00301 257/680 |
| 2011/0121412 A1 | 5/2011 | Quevy et al. |
| 2012/0038372 A1 | 2/2012 | Reinmuth |
| 2012/0043627 A1 | 2/2012 | Lin et al. |
| 2012/0098074 A1 | 4/2012 | Lin et al. |
| 2012/0261744 A1 | 10/2012 | Wang et al. |
| 2012/0261774 A1 | 10/2012 | Graham et al. |
| 2012/0261775 A1 | 10/2012 | Wang et al. |
| 2012/0280594 A1 | 11/2012 | Chen et al. |
| 2012/0326248 A1 | 12/2012 | Daneman et al. |
| 2013/0108074 A1 | 5/2013 | Reining |
| 2013/0214370 A1 | 8/2013 | Hussain et al. |
| 2013/0283912 A1 | 10/2013 | Lin |
| 2013/0334620 A1 | 12/2013 | Chu et al. |
| 2014/0042562 A1 | 2/2014 | Chu et al. |
| 2014/0239353 A1* | 8/2014 | Daneman ............ B81C 1/00158 257/254 |
| 2014/0264648 A1 | 9/2014 | Chu et al. |
| 2014/0264653 A1 | 9/2014 | Cheng et al. |
| 2014/0264661 A1 | 9/2014 | Cheng et al. |
| 2014/0264662 A1 | 9/2014 | Cheng et al. |
| 2014/0319631 A1 | 10/2014 | Chu |
| 2015/0246807 A1 | 9/2015 | Chu et al. |
| 2015/0307346 A1 | 10/2015 | Cheng et al. |
| 2016/0060104 A1 | 3/2016 | Chu et al. |
| 2016/0159643 A1 | 6/2016 | Chu et al. |
| 2016/0159644 A1 | 6/2016 | Chu et al. |

\* cited by examiner

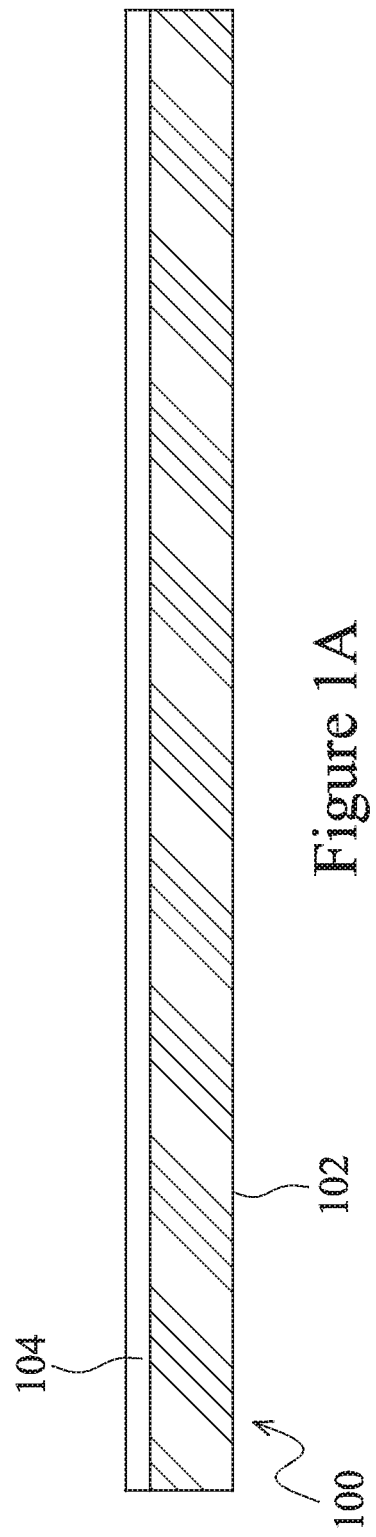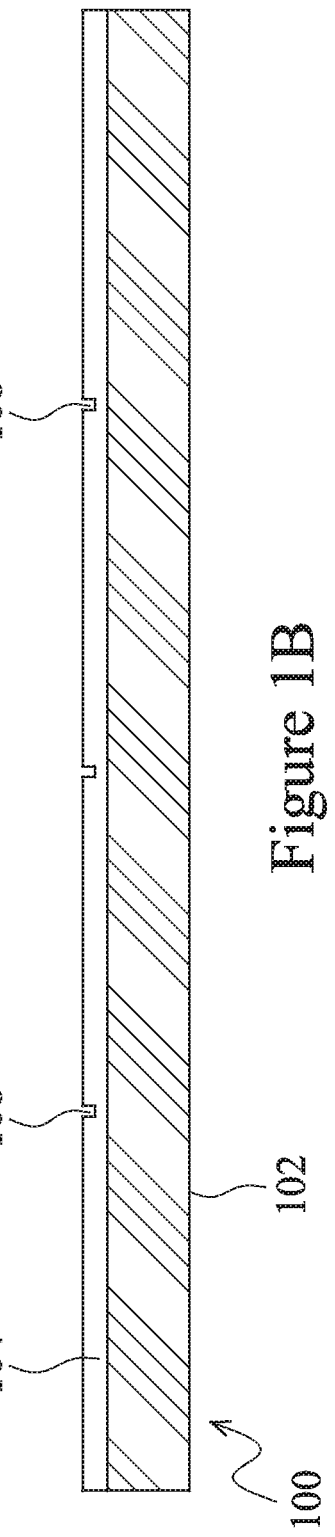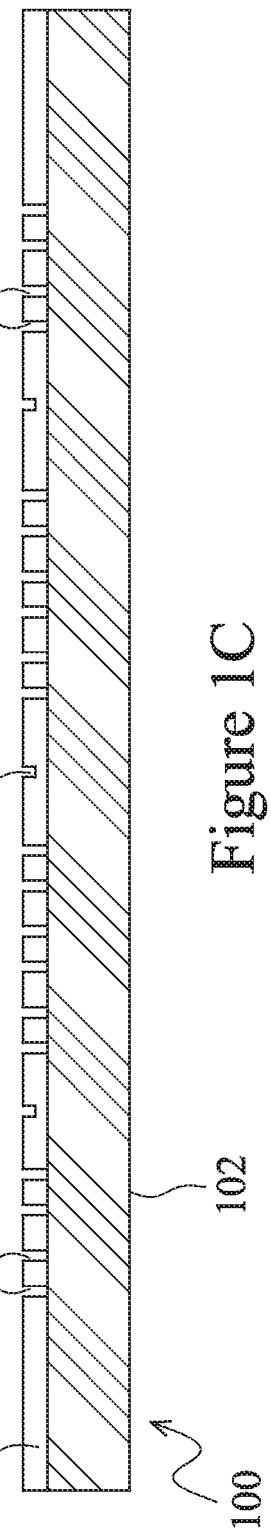

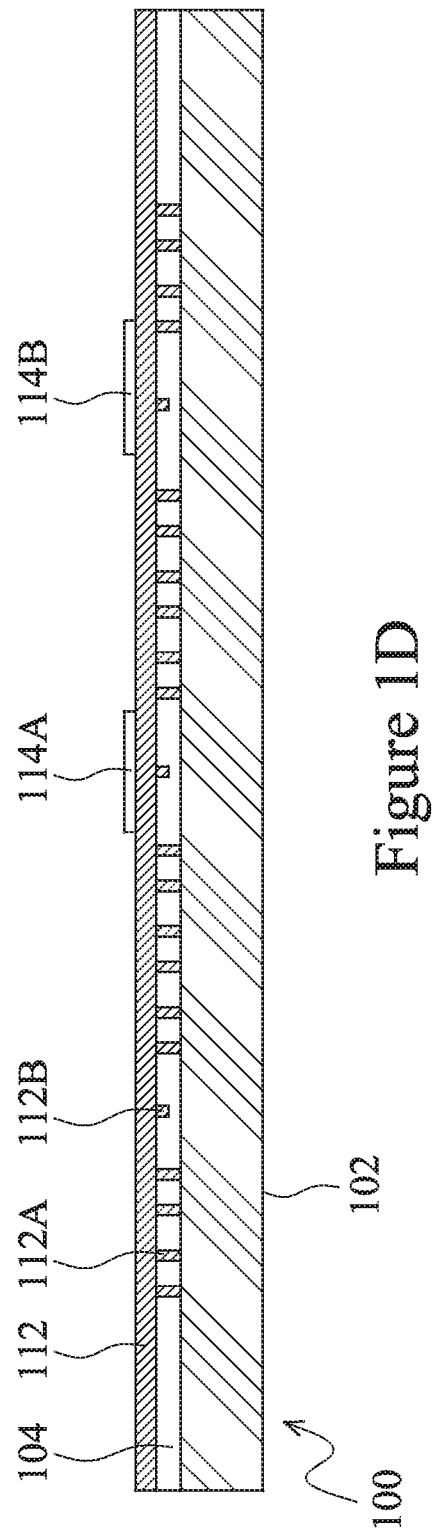
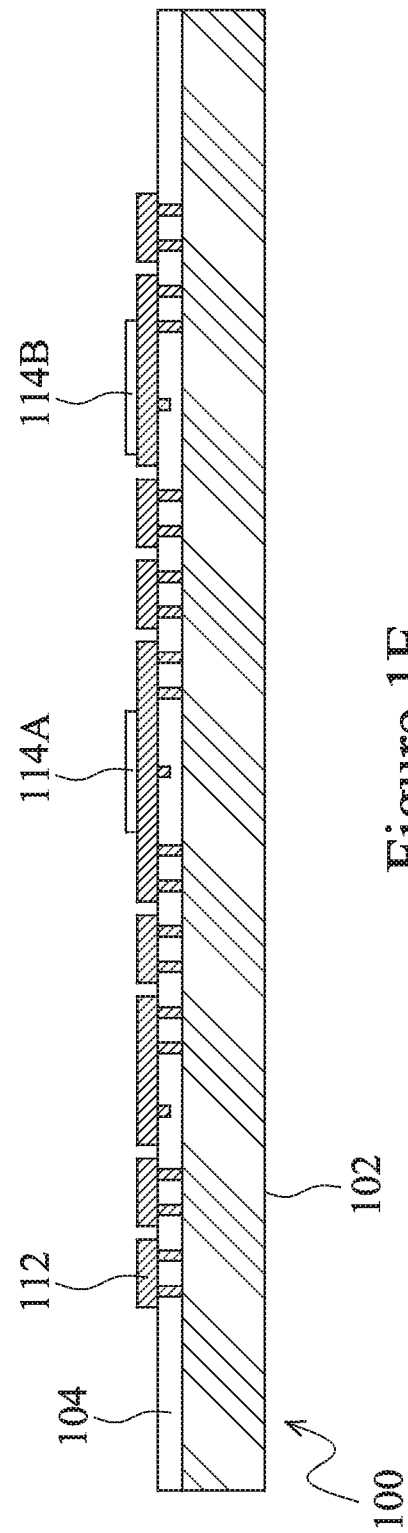

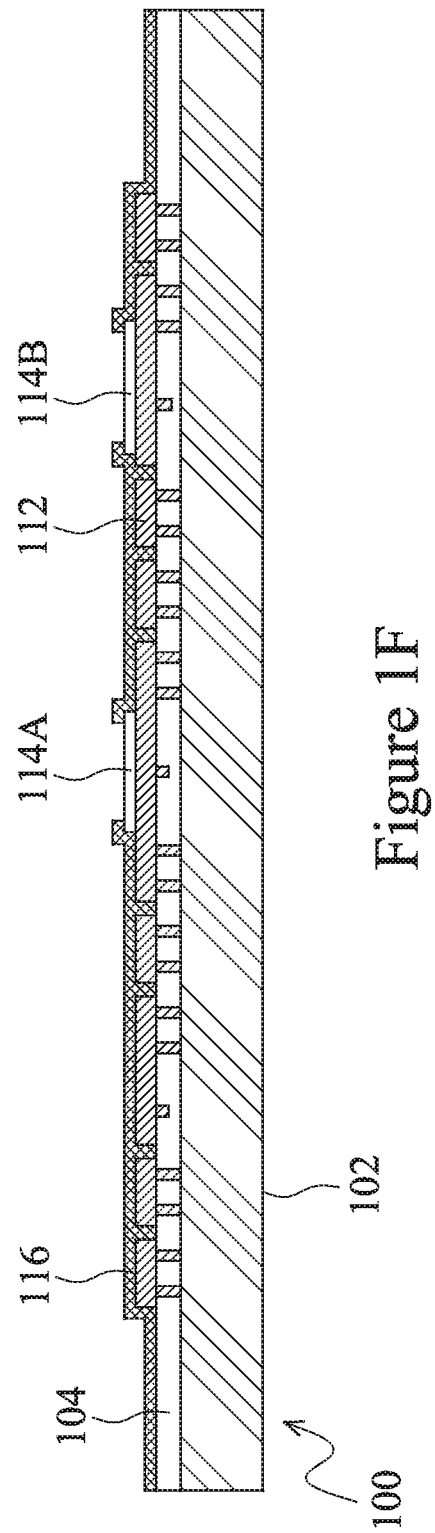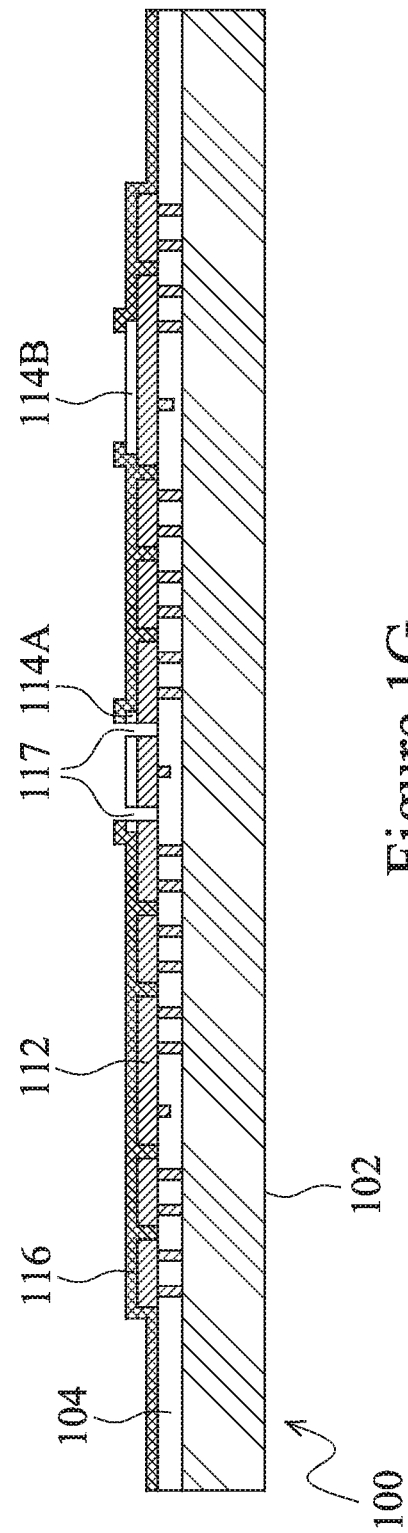

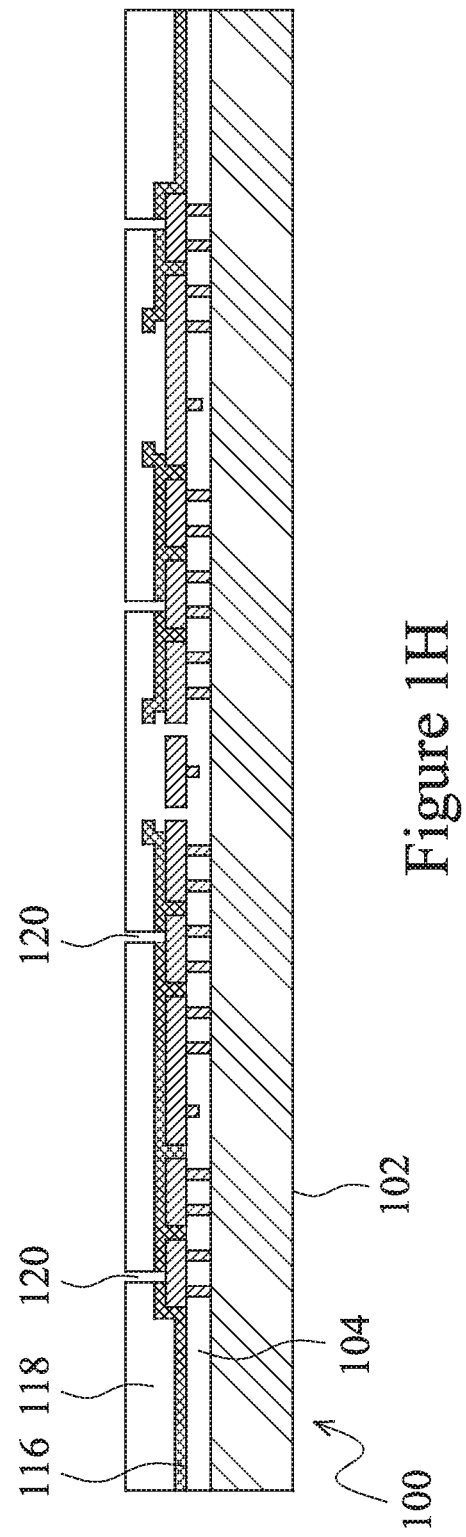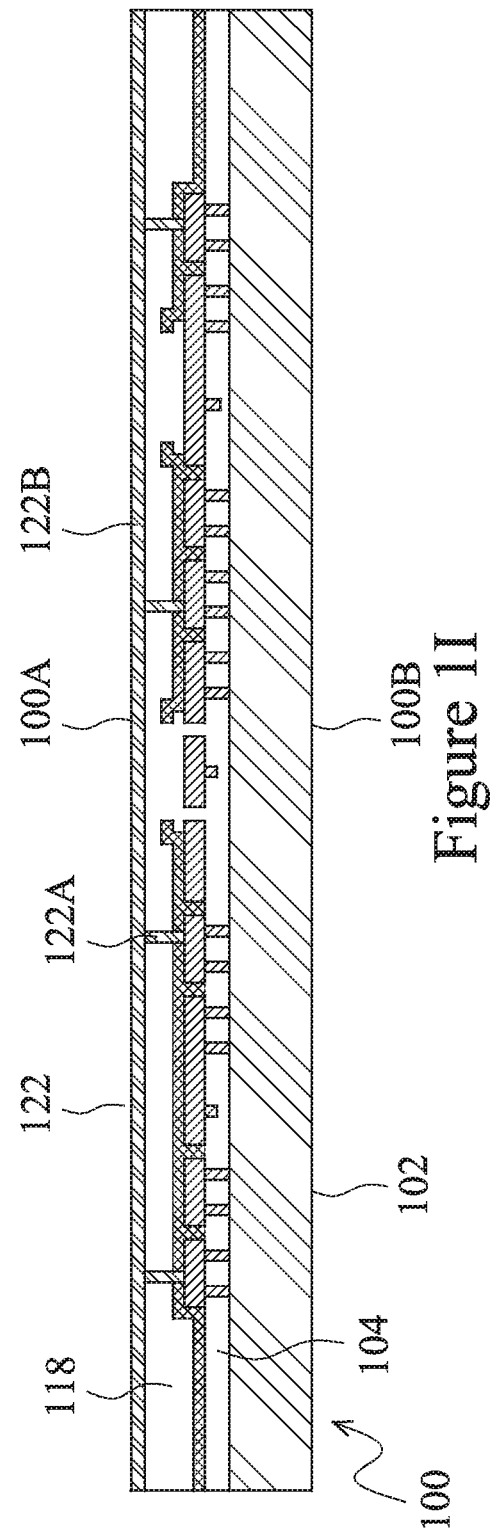

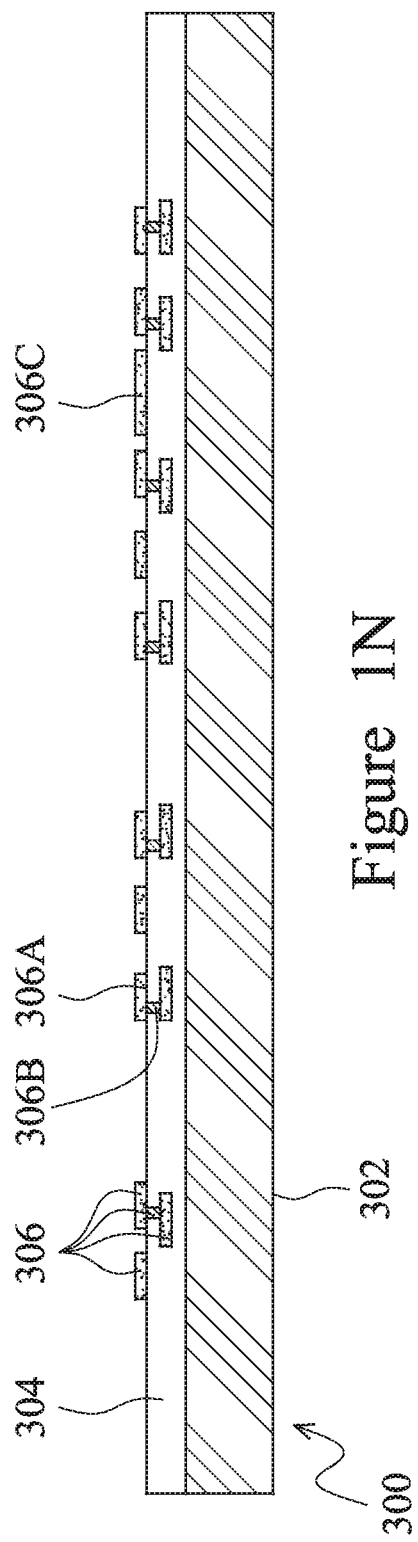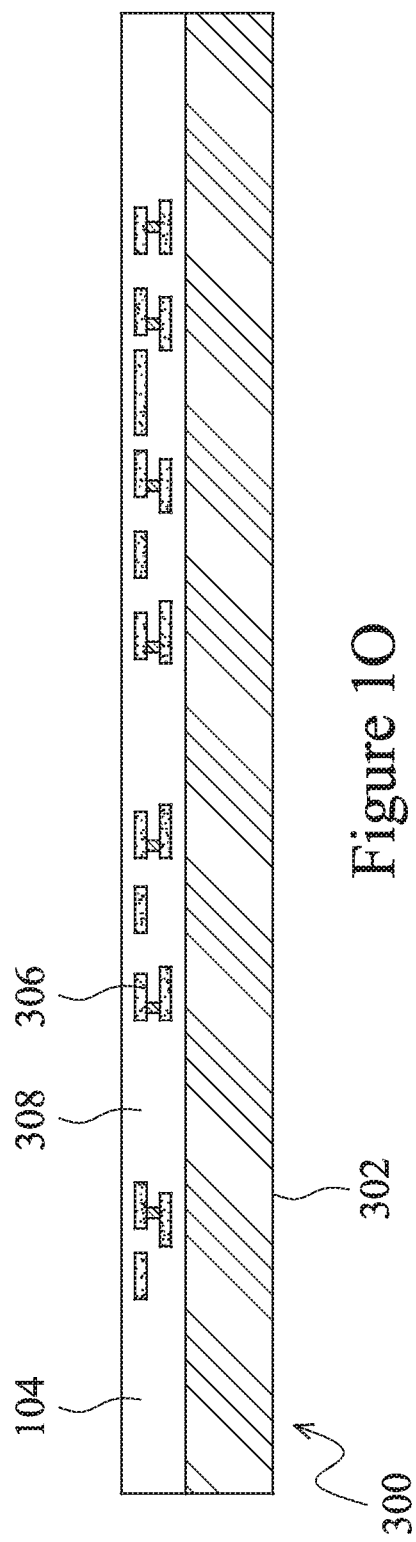

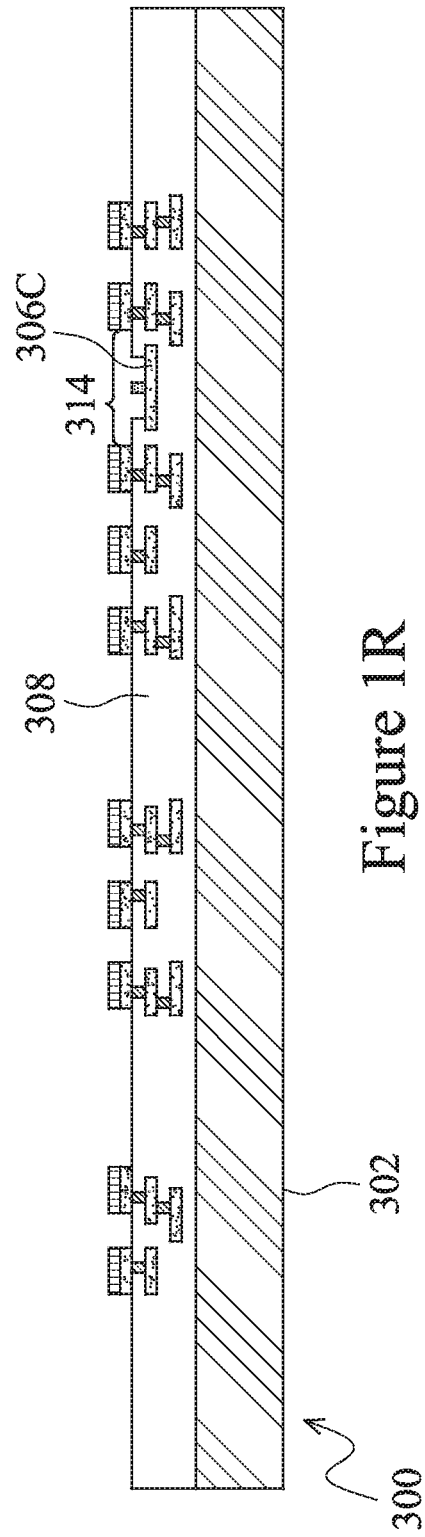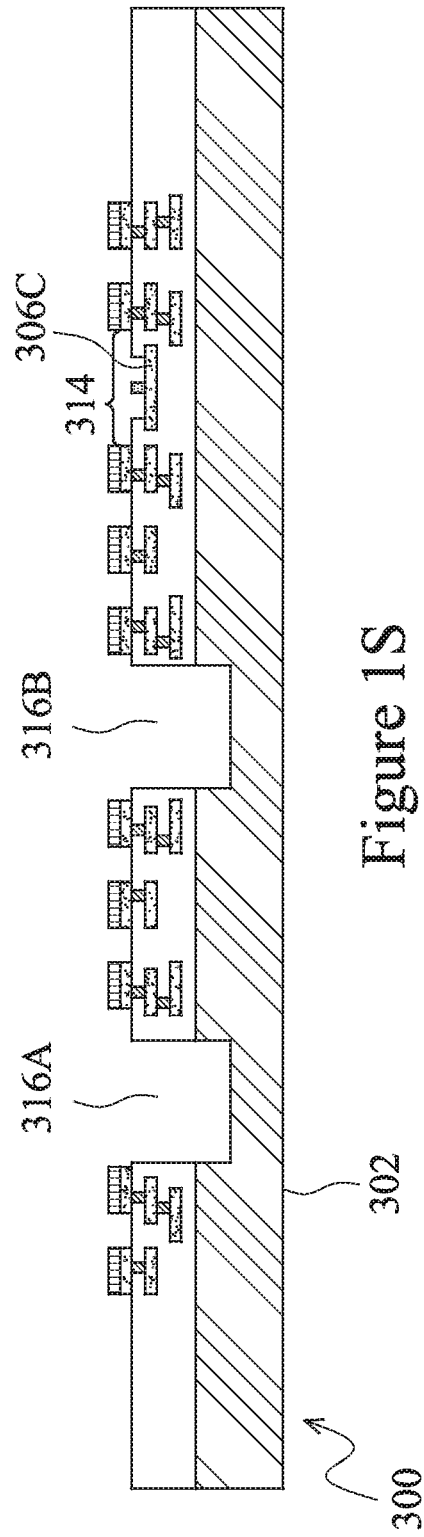

MEMS PRESSURE SENSOR AND MICROPHONE DEVICES HAVING THROUGH-VIAS AND METHODS OF FORMING SAME

This application is a divisional of U.S. application Ser. No. 15/265,434, filed on Sep. 14, 2016 which is a divisional of U.S. application Ser. No. 13/955,957, filed on Jul. 31, 2013, entitled "MEMS Pressure Sensor and Microphone Devices Having Through-Vias and Methods of Forming Same," which claims the benefit of U.S. Provisional Application No. 61/783,475, filed on Mar. 14, 2013 entitled "MEMS Pressure Sensor, Motion Sensor, and Microphone Devices Having Through-Vias and Methods of Forming Same," which application is hereby incorporated herein by reference.

CROSS-REFERENCE TO RELATED APPLICATIONS

This application relates to the following co-pending and commonly assigned patent applications filed on the same date: "MEMS Integrated Pressure Sensor Devices and Methods of Forming Same" Ser. No. 13/894,821; "MEMS Integrated Pressure Sensor and Microphone Devices and Methods of Forming Same" Ser. No. 13/944,382; "MEMS Integrated Pressure Sensor Devices having Isotropic Cavities and Methods of Forming Same" Ser. No. 13/906,105; and "MEMS Device and Methods of Forming Same" Ser. No. 13/893,058.

BACKGROUND

Micro-electromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges. In particular, integrating MEMS pressure sensor devices, MEMS microphone devices, and other MEMS devices (e.g., motion sensor devices) into the same integrated circuit manufacturing process has posed challenges.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Figure 1J:
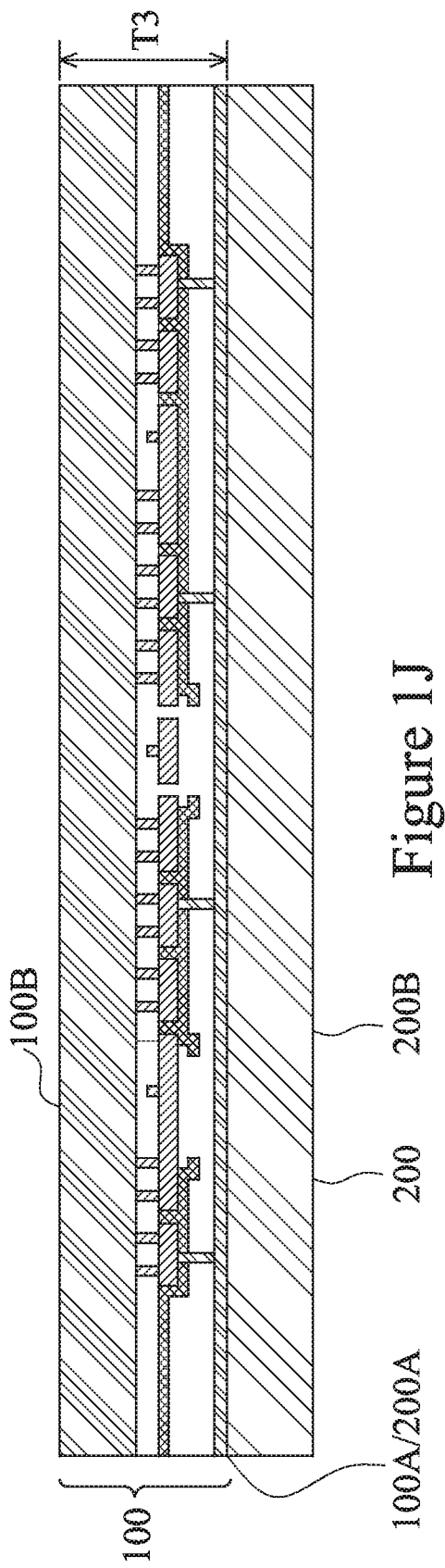
FIGS. 1A-1AB are cross-sectional views of intermediate stages of manufacture of a MEMS device in accordance with various embodiments.
Figure 1K:
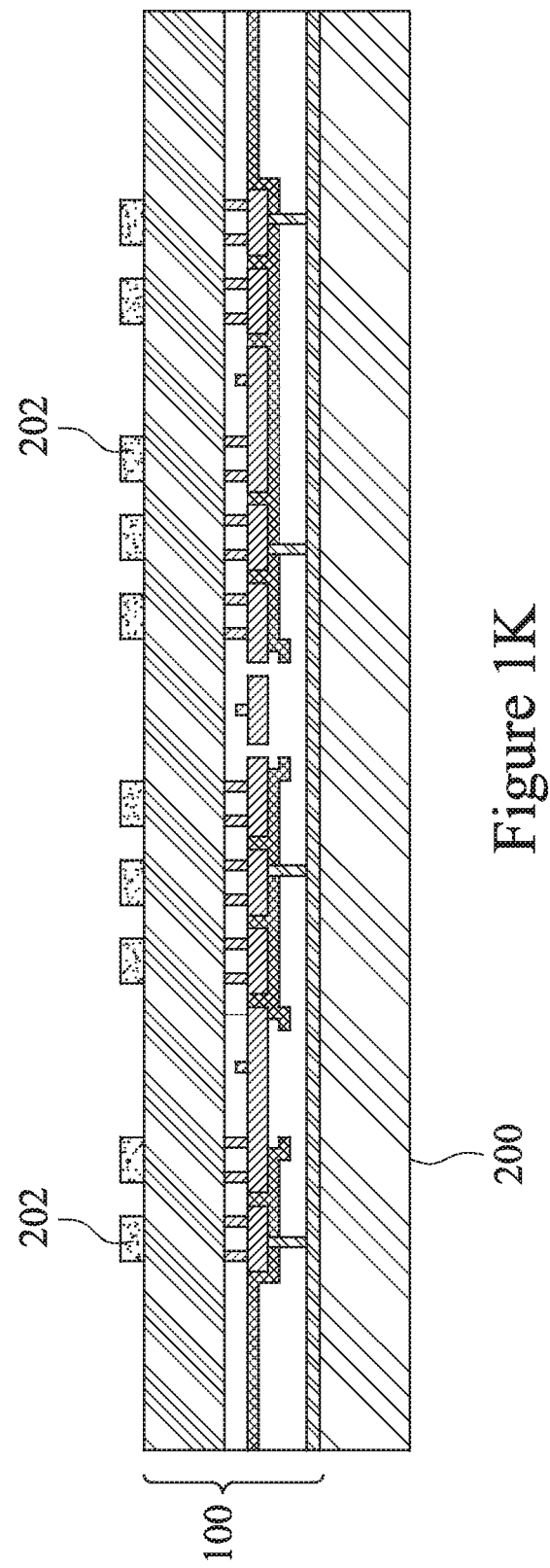
Figure 1L:
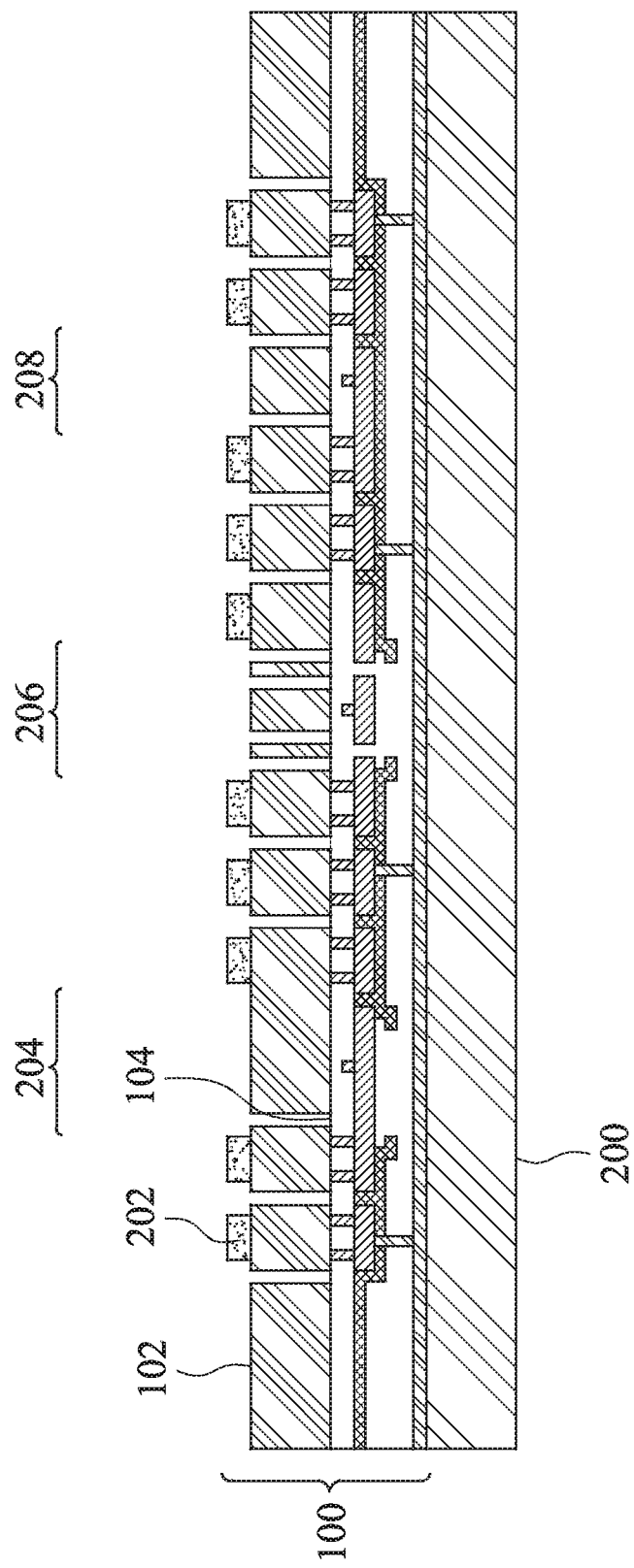
Figure 1M:
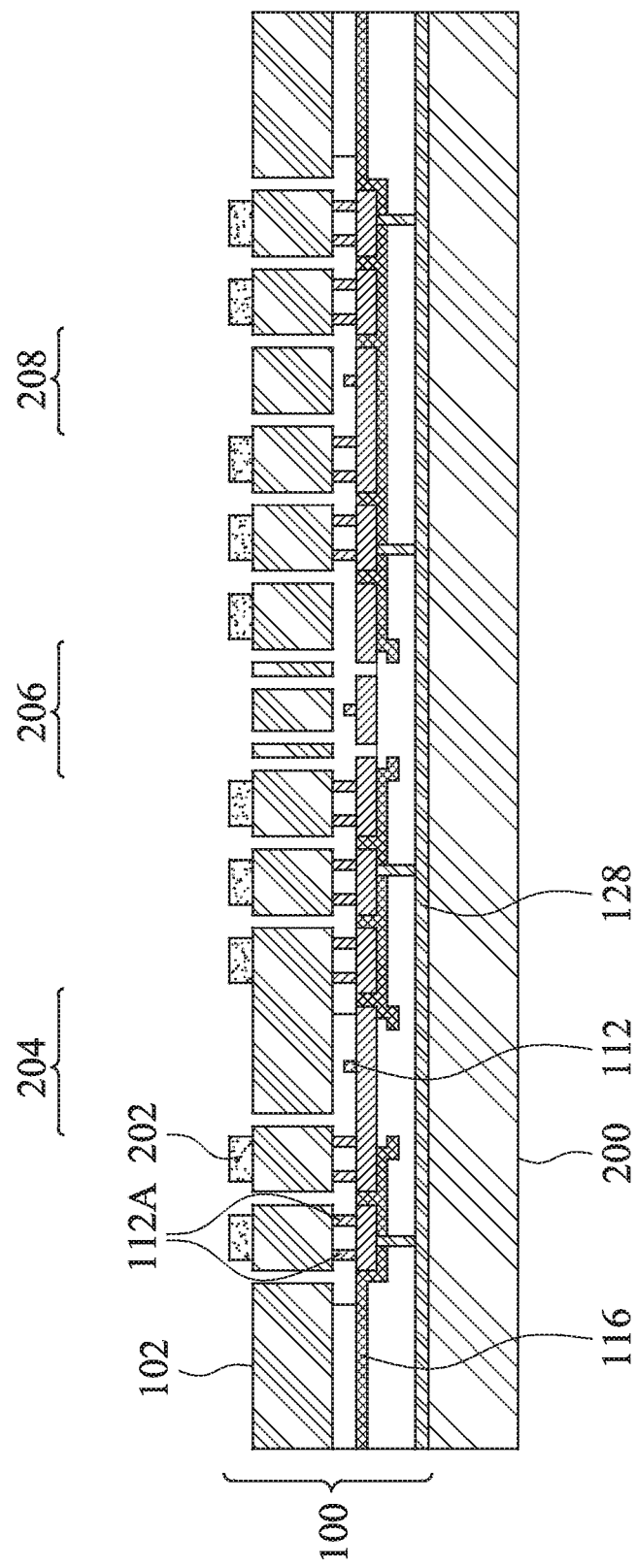
Figure 1P:
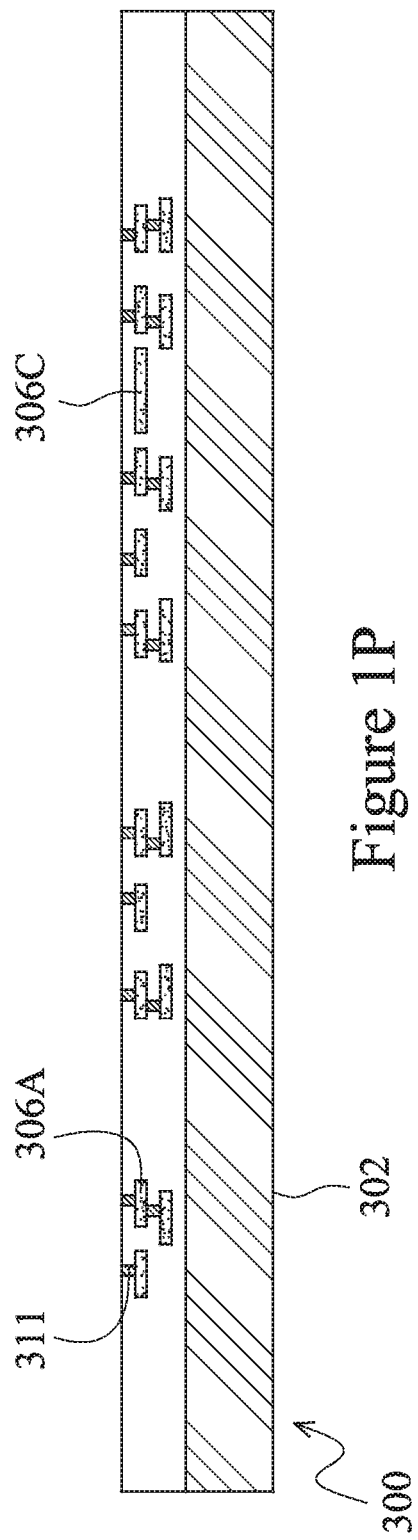
Figure 1Q:
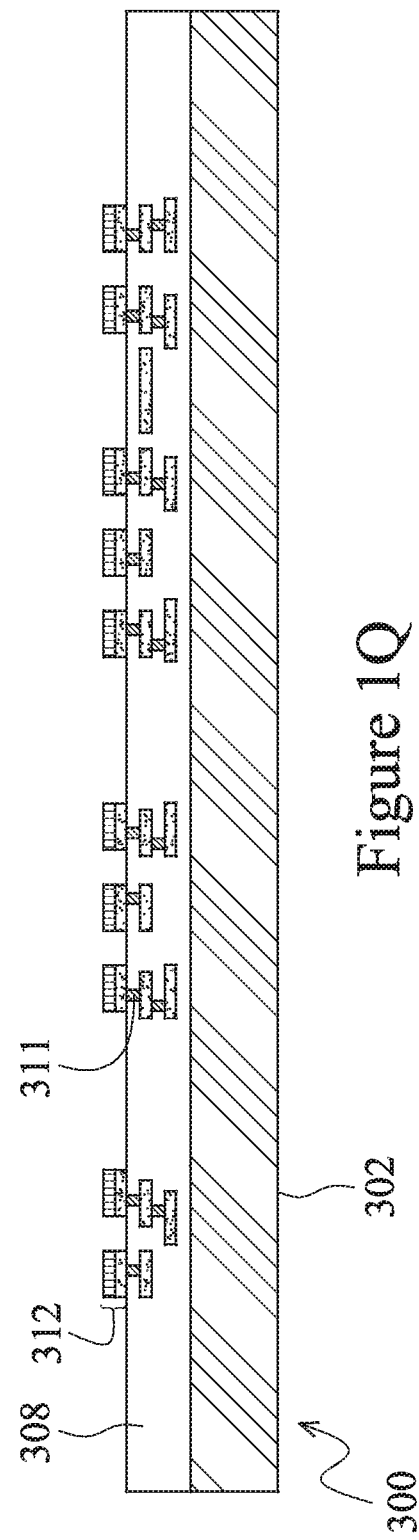
Figure 1T:
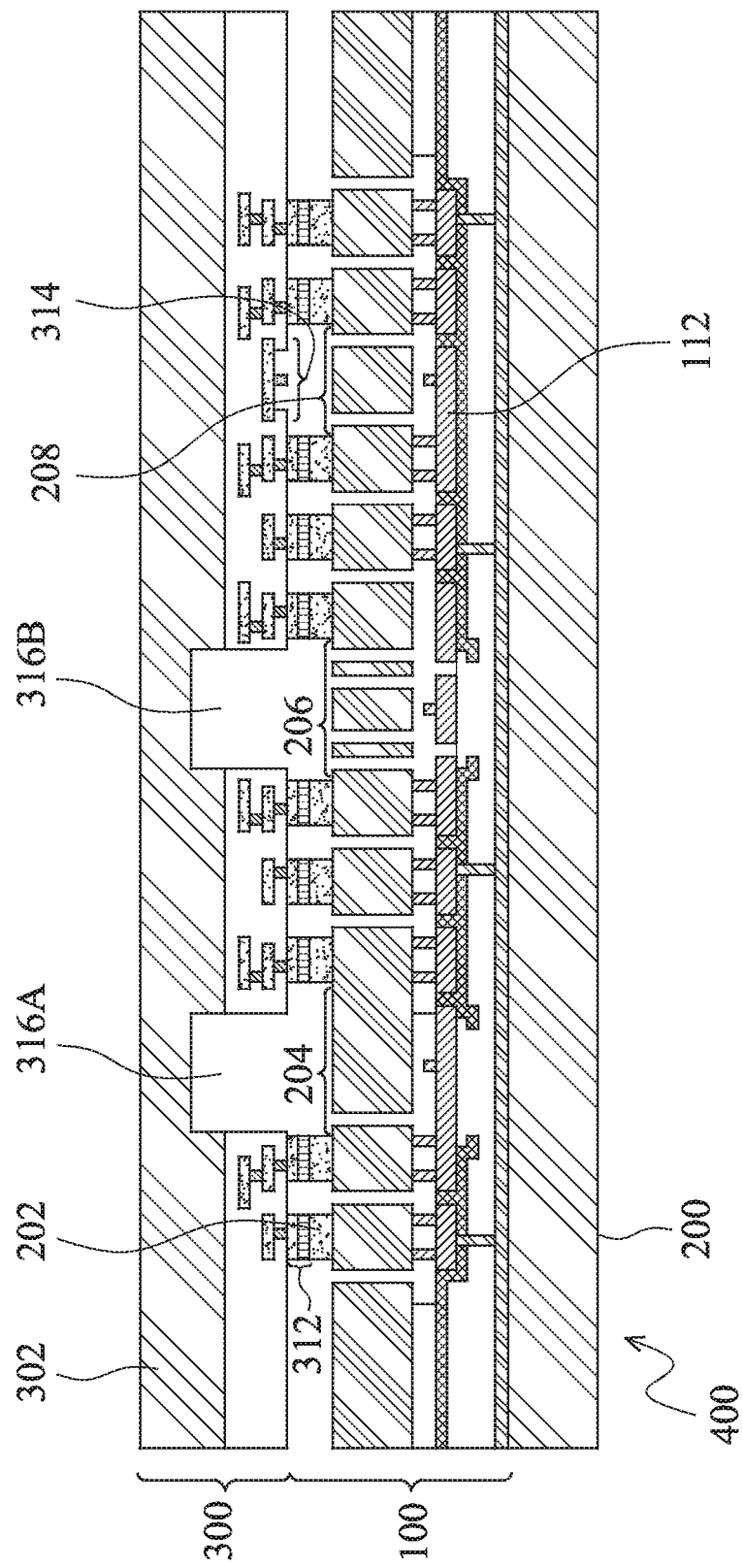
Figure 1U:
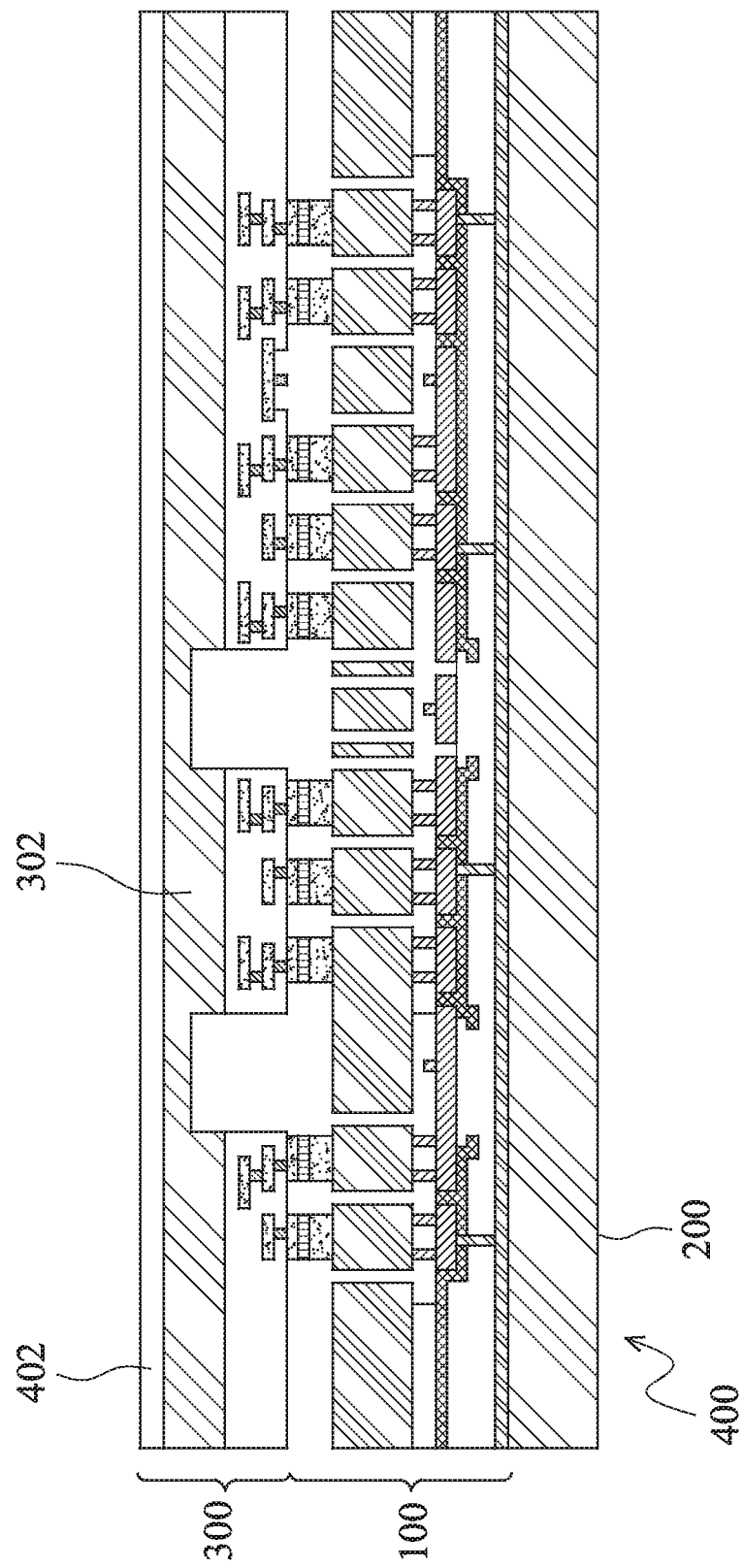
Figure 1V:
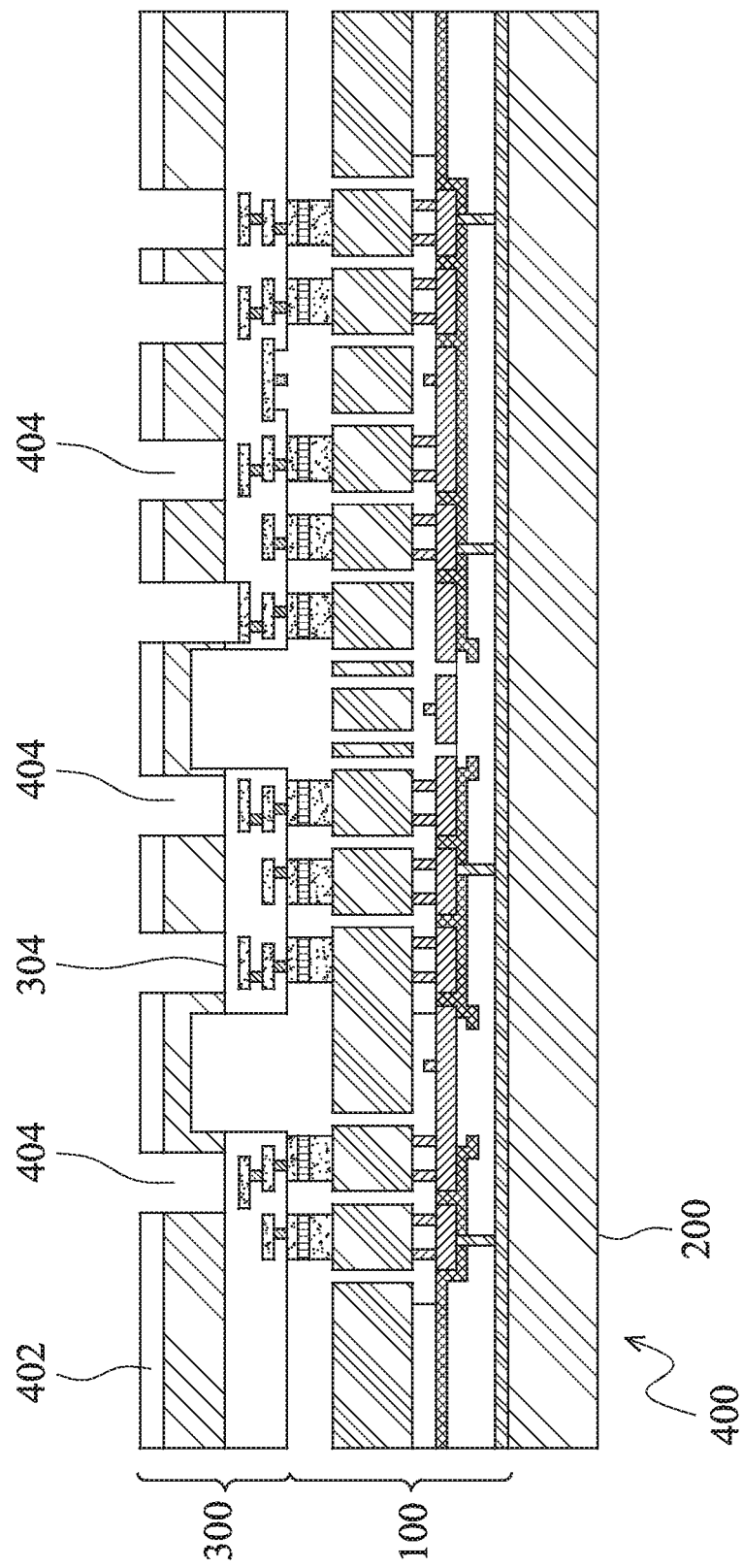
Figure 1W:
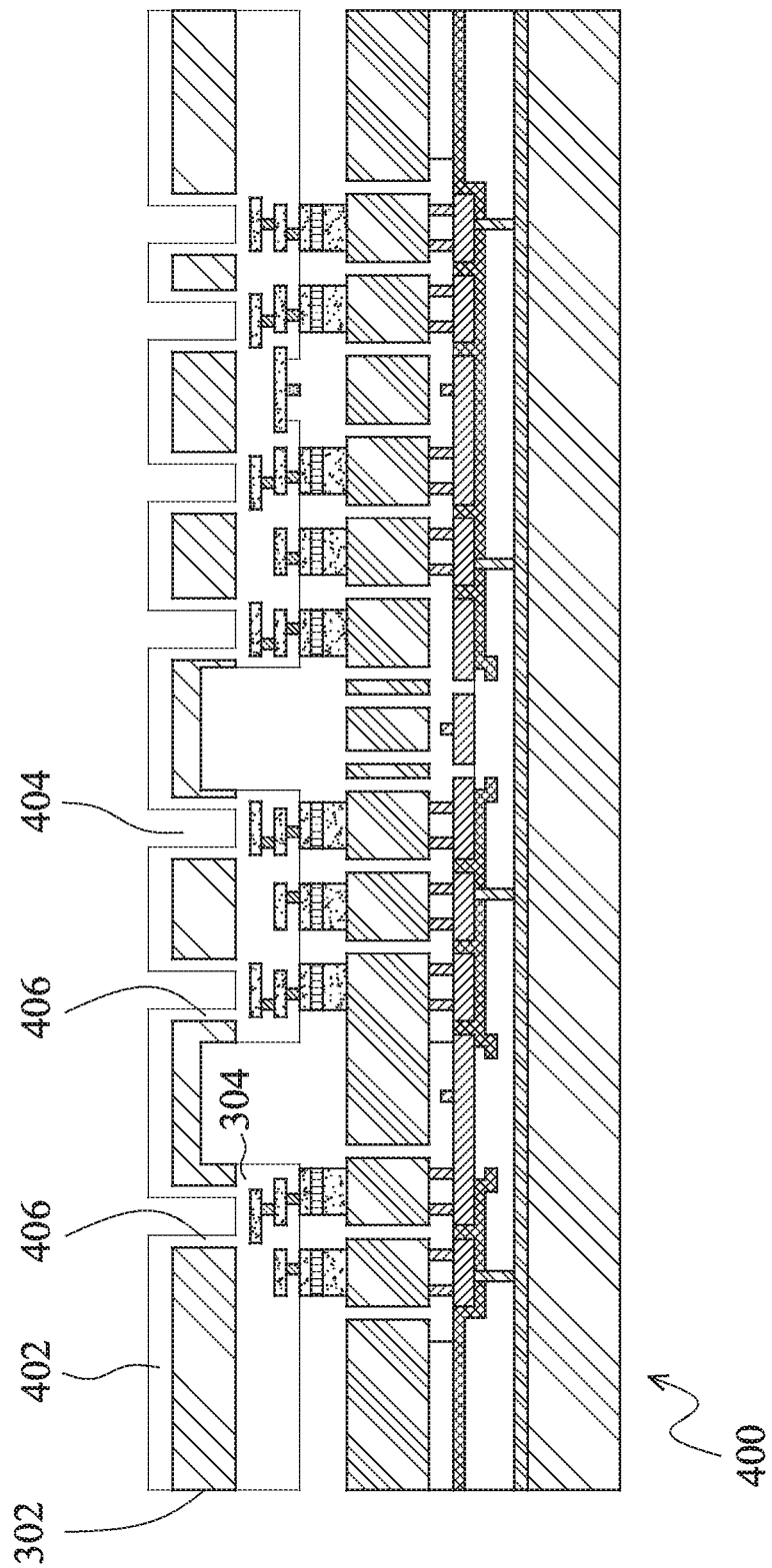
Figure 1X:
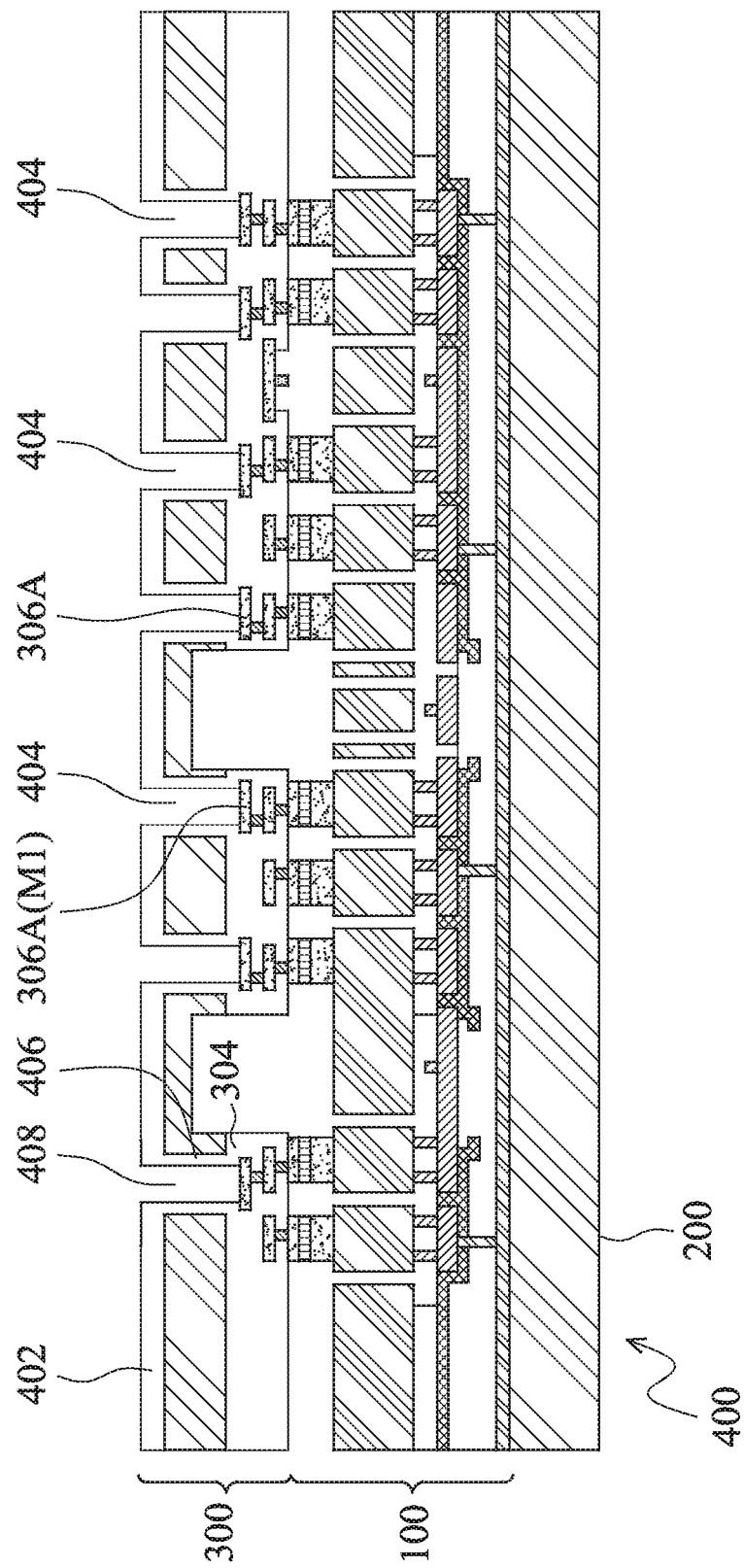
Figure 1Y:
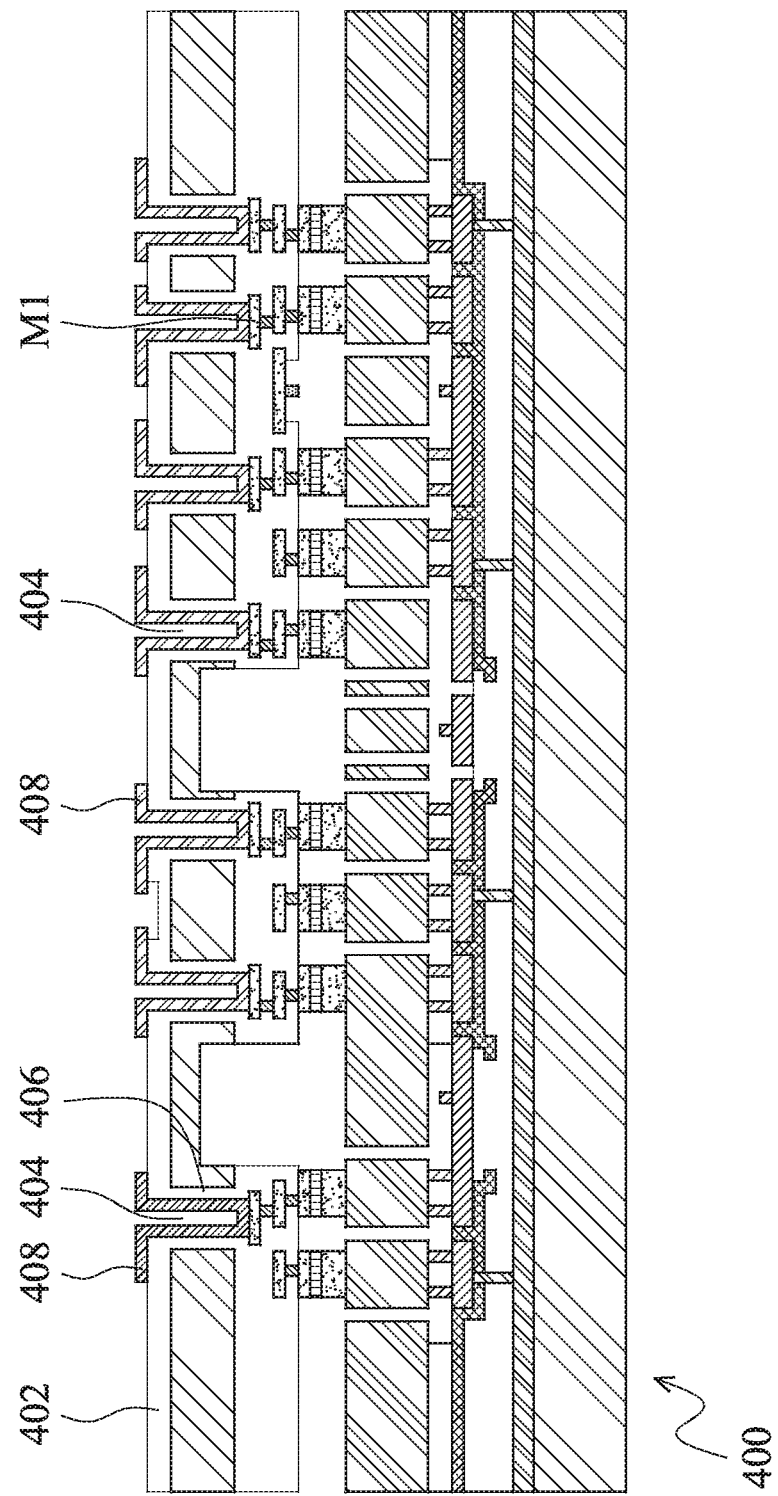
Figure 1Z:
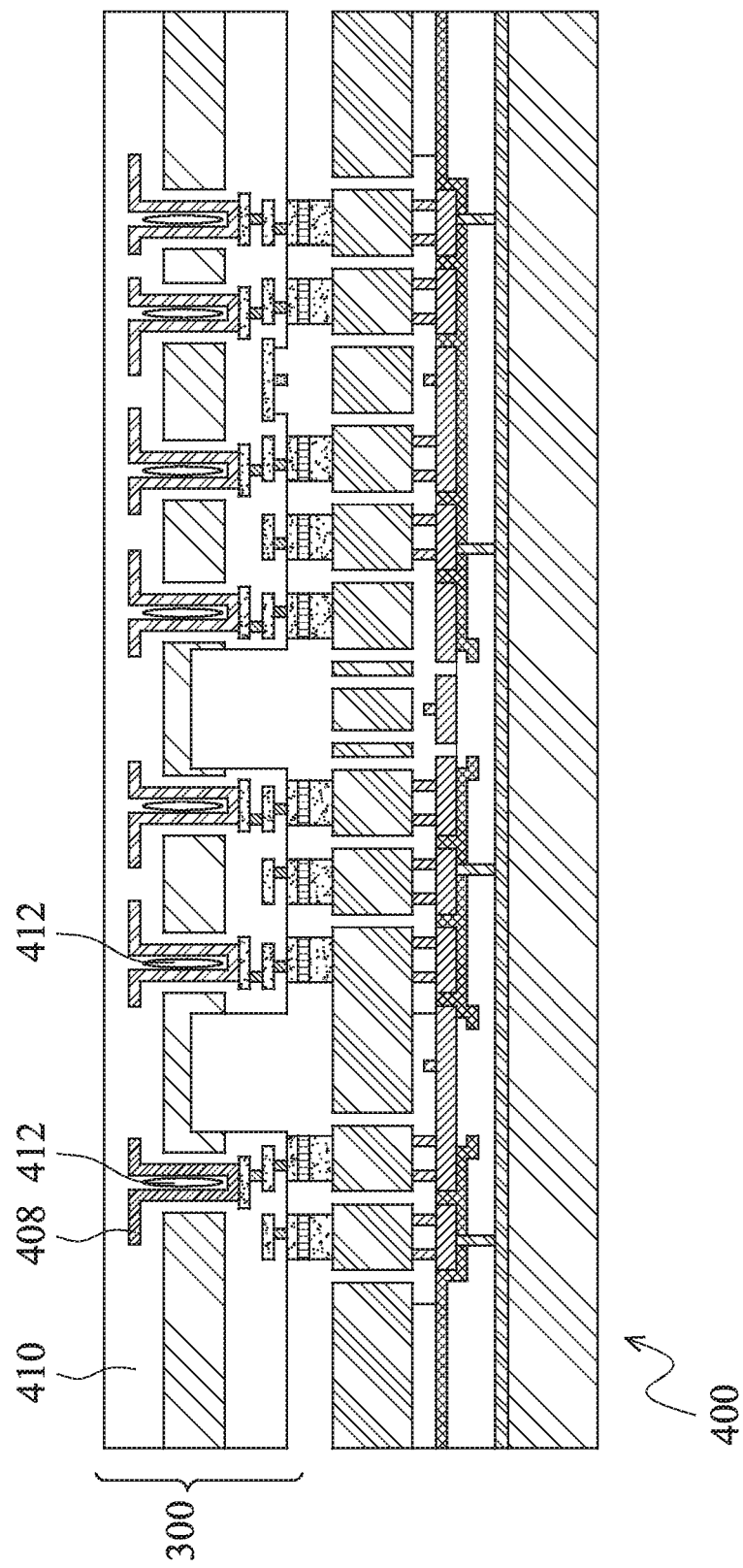
Figure 1A:
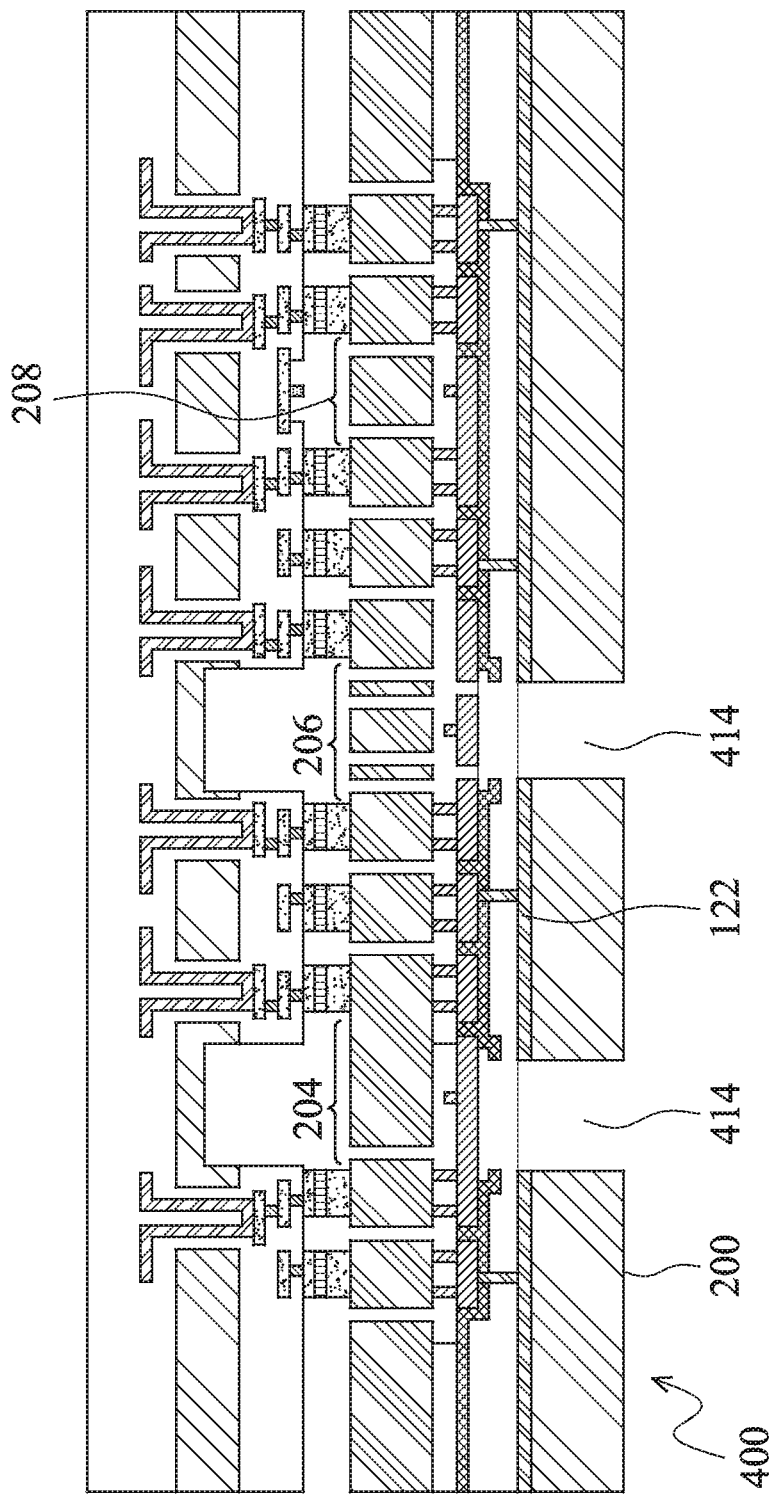
Figure 1A:
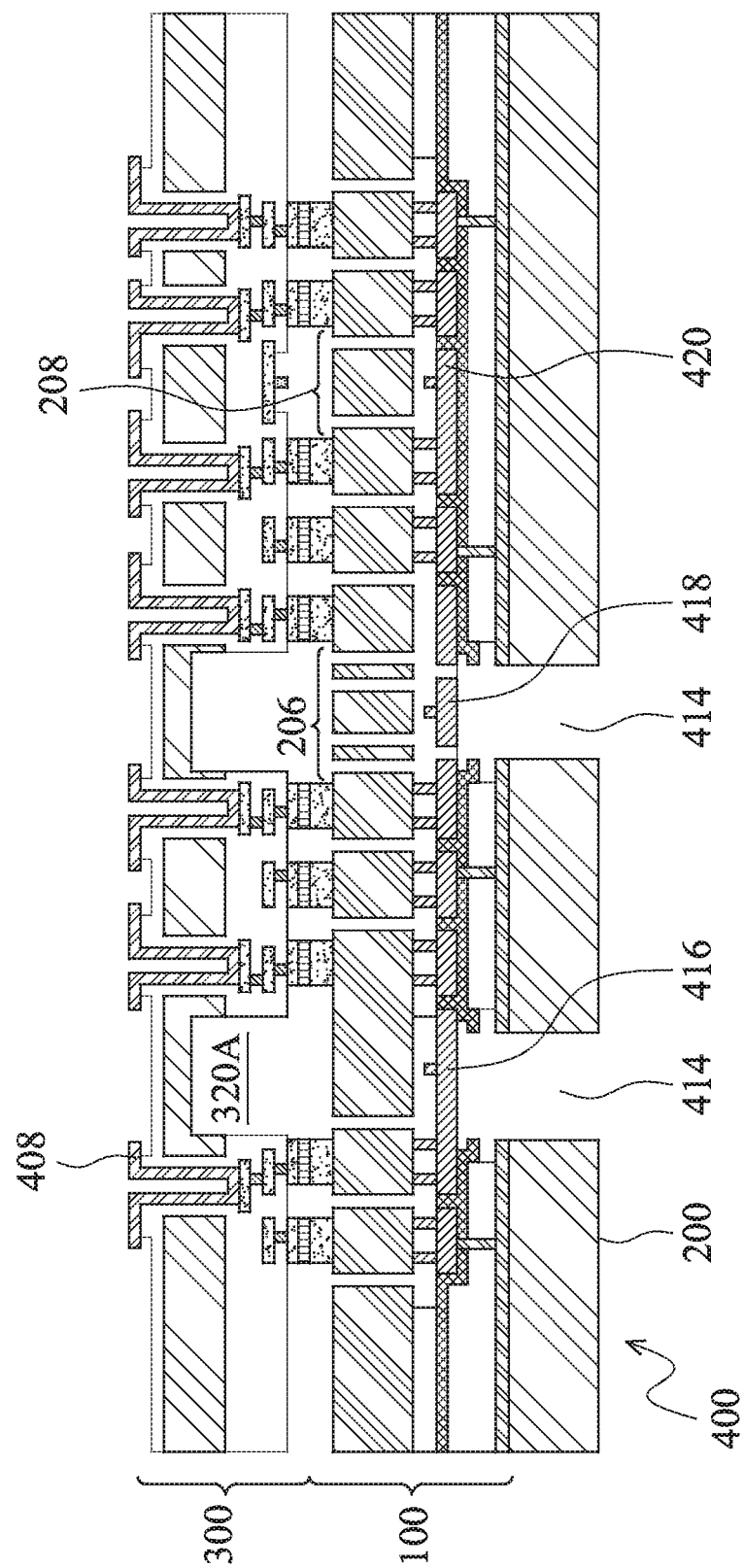

FIGS. 1A-1AB illustrate cross-sectional views of intermediate stages of manufacture of a portion of a MEMS device 400 having a microphone 418, a pressure sensor 416, and another device 420 (see FIG. 1AB). Device 420 may be a MEMS motion sensor, a gyroscope, an accelerometer, or the like. Microphone 418, device 420, and pressure sensor 416 are manufactured using the same integrated circuit (IC) process. Therefore, various embodiments illustrated by FIGS. 1A-1AB allow for the smooth integration of manufacturing a MEMS pressure sensor and microphone devices using known IC manufacturing techniques.

FIGS. 1A-1J illustrate various intermediate stages of manufacture of a MEMS wafer 100 (which may also be referred to as a MEMS chip 100) in accordance with various embodiments. As shown in FIG. 1A, MEMs wafer 100 includes a substrate 102 and a dielectric layer 104. Substrate 102 may be formed of silicon, although other materials such as silicon germanium, silicon carbide, or the like. Substrate 102 may be formed of low resistive silicon. Alternatively, substrate 102 may be a silicon-on-insulator (SOI) substrate. SOI substrate may comprise a layer of semiconductor material (E.g., silicon, germanium, and the like) formed over an insulator layer (e.g., buried oxide), which is formed in a silicon substrate. In addition, other substrates that be used include multi-layered substrates, gradient substrates, hybrid orientation substrates, and the like.

Dielectric layer 104 may be formed of a low-k dielectric material, such as silicon dioxide ($SiO_2$). Dielectric layer 104 may be deposited over substrate 102 using, for example, spinning, chemical vapor disposition (CVD), plasma enhanced chemical vapor deposition (PECVD), low pressure CVD, or other suitable deposition techniques. Furthermore, dielectric layer 104 may be formed of a different suitable material such as low-k dielectrics such as carbon doped oxides, extremely low-k dielectrics such as porous carbon doped silicon dioxide, a polymer such as polyimide, combinations thereof, or the like. Dielectric layer 104 may be released (i.e., removed) in subsequent process steps in order to form MEMS structures; therefore, dielectric layer 104 may also be referred to as oxide release layer 104, sacrificial layer 104, or sacrificial oxide layer 104.

Furthermore, voids (not shown) may or may not be embedded in oxide release layer 104 to decrease oxide release time during a subsequent selective oxide etching process (e.g., vapor HF). Voids may be embedded by depositing and patterning a first portion of oxide release layer 104 to form a plurality of small openings using, for example, a combination of photolithography and etching techniques. The upper portions of the small openings may then be seamed together to seal the small openings, and create voids. The small openings may be seamed together using, for example, an oxide deposition process applied to the upper surface of first portion of oxide release layer 104. For example, the deposition of additional oxide material (i.e., the remaining portion of oxide release layer 104) over the first portion of oxide release layer 104 may be employed to seal off the upper portions of the openings. The oxide deposition may be formed using a deposition process such as CVD or the like. More particularly, by controlling the deposition process, the material of oxide release layer 104 may be deposited in a non-conformable manner. That is, the material of oxide release layer 104 may build up on the upper portions of the small openings faster than along the sidewalls and bottom of the small openings. This process leads to the formation of an overhang at the edge of the upper portion of the small openings, and as the deposition process continues, the overhangs will merge, sealing off the small openings with a plurality of seams and forming voids embedded in oxide release layer 104.

In FIGS. 1B and 1C, oxide release layer 104 is patterned, creating bump openings 108 and via openings 110. The patterning of oxide release layer 104 may be done using, for example, a combination of photolithography and etching techniques. Two separate photolithography steps may be performed in order to create bump openings 108 and via openings 110. For example, a shallow etching may be performed to create bump openings 108, while a deeper etching may be performed to create via openings 110. As shown in FIGS. 1B and 1C, bump openings 108 do not extend to substrate 102 while via openings 110 extend to and expose portions of substrate 102. Furthermore, oxide release layer 104 may be thinned (not shown) until a desired thickness is achieved. The thinning process may be implemented by using suitable techniques such as grinding, polishing, and/or chemical etching. For example, a chemical mechanical polishing (CMP) process may be used to thin oxide release layer 104. In accordance with various embodiments, the thickness of oxide release layer 104 is in a range from about 0.5 µm to about 5 µm.

In FIG. 1D, a conductive layer 112 is deposited over oxide release layer 104 using, for example, CVD. Conductive layer 112 may be made of polysilicon, and may be referred to as polysilicon layer 112 hereinafter. Polysilicon layer 112 fills via openings 110 and bump openings 108, forming polysilicon vias 112A and polysilicon bumps 112B respectively. Polysilicon vias 112A may be formed for electrical routing and may further act as a mechanical structure. For example, polysilicon vias 112A may be used as a vapor hydrogen-fluoride (vapor HF) etch stop layer in subsequent process steps. Furthermore, in some embodiments, polysilicon bumps 112B may be used as mechanical bumps to limit the motion of moving elements in MEMS device 400, or as anti-stiction bumps. In alternative embodiments, layer 112 may be formed of a different material in lieu of polysilicon such as SiGe, single crystal silicon (e.g., by using a silicon-on-insulator wafer as a starting material), and the like. It should be noted that while a single polysilicon layer is illustrated, those skilled in the art will recognize that multiple polysilicon layers could be employed.

An oxide mask layer 114 (labeled as 114A and 114B) may be formed and patterned over portions of polysilicon layer 112. Oxide mask layer 114 is formed out of a similar material and using similar methods as oxide release layer 104, and oxide mask layer 114 may be patterned using for example, a combination of photolithography and etching. Oxide mask layer 114 acts as protection for critical portions of polysilicon layer 112 in subsequent process steps. For example, in FIG. 1D, oxide mask layer protects portions of polysilicon layer 112 to ensure proper thickness control and surface texture. Oxide mask layer 114 may be formed over any portion of polysilicon layer 112 where such control is desired. If surface texture and thickness is not crucial, oxide mask layer 114 may be omitted.

In FIG. 1E, polysilicon layer 112 is patterned using for example a combination of photolithography and etching. The patterning of polysilicon layer 112 may be done in order to create portions of various devices in MEMS device 400. For example, the patterning of polysilicon layer 112 in FIG. 1E creates separate portions of polysilicon layer 112 for inclusion as a bottom electrode of a motion sensor (or other applicable device), a membrane of a pressure sensor, and a membrane of a microphone device respectively.

In FIG. 1F, etch stop layer 116 is formed and patterned over oxide release layer 104 and polysilicon layer 112. Etch stop layer 116 may be deposited using, for example, low pressure chemical vapor deposition (LPCVD). Etch stop layer 116 may be patterned (e.g., using photolithography and etching) to expose portions of oxide mask layer 114. Etch stop layer 116 may be used as a vapor HF etch stop layer and may be formed of a low-stress nitride (LSN). However, other materials such as aluminum nitride, aluminum oxide, silicon carbide, or other dielectrics chemically resistant to vapor HF may be used as well.

In FIG. 1G, oxide mask layer 114 and polysilicon layer 112 are patterned to include release holes 117 and to expose portions of oxide release layer 104. The patterning process may be done using, for example, a combination of photolithography and etching. Release holes 117 provide a path to remove oxide release layer 104 in subsequent process steps. The portion of polysilicon layer 112 disposed near release holes 117 may be used as a membrane of a microphone device in MEMS device 400 (see element 418 in FIG. 1AB).

FIG. 1H illustrates the formation and patterning of another oxide release layer 118. Oxide release layer 118 may be formed of substantially the same material and using substantially the same methods as oxide release layer 104. The thickness of oxide release layers 104 and 118 may be designed to control parasitic feedback through capacitance and/or the gap between the subsequent movable element of MEMS wafer 100 and the thin polysilicon layer 122 (see FIG. 1I). Oxide release layer 118 may be blanket deposited and then undergo a thinning process (e.g., CMP or etch-back) to reach a desired flatness and/or thickness. Oxide release layer 118 (and corresponding portions of etch stop layer 116) is patterned to create via openings 120, exposing portions of polysilicon layer 112, using for example, a combination of photolithography and etching.

FIG. 1I illustrates the formation of a thin polysilicon layer 122 over oxide release layer 118. Thin polysilicon layer 122 may formed on oxide release layer 118 using suitable techniques such as CVD, and the like. Thin polysilicon layer 122 is deposited into via openings 120, creating via portions 122A. Thin polysilicon layer 122 may act as electrical routing and an interconnect structure (e.g., using via portions 122A and line portions 122B electrically connecting portions of polysilicon layer 112).

Furthermore, thin polysilicon layer 122 may also act as a shield for various components of MEMS wafer 100 (e.g., substrate 102 and polysilicon layer 112) in subsequent process steps. Thin polysilicon layer 122 may also act as a bonding interface layer; therefore, other suitable bonding materials such as silicon, amorphous silicon, silicon doped with impurities, combinations thereof, and the like may be used in lieu of polysilicon.

In FIG. 1J, MEMS wafer 100 is bonded to a carrier wafer 200. Carrier wafer 200 (which may also be referred to as a carrier chip 200) may be a substrate that is substantially similar to substrate 102 in MEMS wafer 100. Carrier wafer 200 also has a top and bottom surface, 200A and 200B respectively.

Top surface 100A of MEMS wafer 100 is bonded to top surface 200A of carrier wafer 200. MEMS wafer 100 may be bonded to carrier wafer 200 using any suitable technique such as fusion bonding, anodic bonding, eutectic bonding, and the like. In various embodiments, MEMS wafer 100 may be fusion bonded to carrier wafer 200 using second thin polysilicon layer 122 as a bonding interface.

Furthermore, MEMS wafer 100 may be thinned to a desired thickness T3. The thinning process may include grinding and chemical mechanical polishing (CMP) processes, etch back processes, or other acceptable processes performed on surface 100B of MEMS wafer 100 (i.e., substrate 102). As a result of this thinning process, MEMS wafer 100 may have a thickness between about 5 µm to about 60 µm.

In FIG. 1K, conductive bonds 202 are formed and patterned over substrate 102 (i.e., bottom surface 100B of MEMS wafer 100). Conductive bonds 202 may be formed of aluminum copper (AlCu) and are used for eutectic bonding in subsequent process steps. Alternatively, a different conductive material suitable for eutectic bonding such as Ge, Au, combinations thereof, or the like may be used instead.

In FIG. 1L, portions of substrate 102 are patterned using for example, a combination of photolithography and etching. The portions of the remaining substrate 102 may form various MEMS structures (e.g., MEMS structures 204, 206, and 208). MEMS structure 204 may act as a bottom electrode of a pressure sensor device in finished MEMS device 400. MEMS structure 206 may act as a bottom electrode of a microphone device in finished MEMS device 400. MEMS structure 208 may be patterned to act as a proof mass of a motion sensor device in finished MEMS device 400. Alternatively, MEMS structure 208 may be patterned to be portions of other MEMS devices such as a spring (e.g., for a gyroscope), a series of fingers in a comb (e.g., for an accelerometer), or the like.

FIG. 1M illustrates the release of the MEMS structures 204, 206, and 208 by a vapor HF etching of portions of oxide release layers 104 and 118. This type of etch process has a high selectivity between the various oxide release layers, etch stop layer 116, polysilicon layer 112, thin polysilicon layer 122, and carrier wafer 200 so that that polysilicon layer 112, carrier wafer 200, and etch stop layer 116 are not significantly attacked during the removal of portions of the various oxide release layers. Furthermore, portions of polysilicon layers 112 (e.g., vias 112A) and etch stop layer 116 protects portions of the various oxide release layers during the etch process. These protected regions (i.e., the remaining portions of the various oxide release layers) may be referred to as anchor regions. This etch process allows for free movement of the movable elements of MEMS structure 208 in at least one axis. Furthermore, MEMS structures 204 and 206 may be designed to be stiff and have relatively limited ranges of motion even after the vapor HF process. It should be noted that the portions of oxide release layers to be removed depend on layout design.

FIGS. 1N-1S illustrate various intermediate steps of manufacture of a cap wafer 300 (which may also be referred to as a cap chip 300) for inclusion in the completed MEMS device 400. Cap wafer 300 may or may not be a CMOS wafer, which may or may not have electrical circuits (not shown). In particular cap wafer 300 may include various active devices such as transistors, capacitors, resistors, diodes, photodiodes, fuses and the like. The electrical circuits may be interconnected to perform one or more functions suitable for a particular application, which may or may not be related to MEMS structures 204, 206, and 208. FIG. 1N illustrates cap wafer 300 as having substrate 302, oxide layers 304, and interconnect structure 306 (including metal lines 306A and metal vias 306B). Interconnect structure 306 may be used for electrical routing. Metal lines 306A may be formed of, for example, AlCu while metal vias 306B may be formed of, for example tungsten although other metallic materials may also be used to form the features of interconnect structure 306.

In FIG. 1O, conforming oxide layer 308 may be deposited over interconnect structure 306 and oxide layers 304 using any suitable technique, such as CVD, and the like and may be formed of a low-k dielectric material. Oxide layer 308 may undergone a thinning process (e.g., CMP) to achieve a desired topography and thickness.

FIG. 1P illustrates insertion of contact plugs 311 into cap wafer 300. Contact plugs 311 may be formed of tungsten, although other metallic materials such as aluminum or copper may also be used. Contact plugs 311 may be formed for example, by patterning conforming oxide layer 308, exposing certain metal lines 306A. A metallic material, e.g., tungsten, may be deposited in the patterned openings and a CMP technique may be used so that the top surface of contact plugs 311 is level with the top surface of conforming oxide layer 308. Contact plugs 311 are electrically connected to interconnect structure 306. It should be noted that certain metal lines (e.g., metal line 306C) of interconnect structure 306 may not be connected to any contact plugs 311.

In FIG. 1Q, bonding material layers 312 (alternatively referred to as bonds 312) are formed over a top surface of conforming oxide layer 308. Bonding material layer may be blanket deposited and patterned using for example physical vapor deposition (PVD) and photolithography/etching. Bonding material layers 312 may be made of a layer of aluminum copper under a layer of germanium although other metallic materials such as gold may also be used. Bonding material layers 312 may act as a eutectic bonding material for a subsequent bonding process. Bonding material layers 312 may or may not be electrically connected to interconnect structure 306 via contact plugs 311.

In FIG. 1R, an etching is performed on portions of conforming oxide layer 308 exposing portions of interconnect structure 306. A portion of conforming oxide layer 308 corresponding to metal line 306C may be etched to form bumps 314. Bumps 314 may serve a variety of purposes. For example, in an embodiment, bumps 314 are mechanical bumps included to limit the motion of moving elements in MEMS device 400. Bumps 314 may also be used as antistiction bumps.

In FIG. 1S, cavities 316 (including cavities 316A and 316B) are formed in cap wafer 300. Notably, cavities 316 do not penetrate through the entire thickness of substrate 302.

FIG. 1T illustrates the stacked MEMS device 400, wherein cap wafer 300 is stacked over MEMS wafer 100 and carrier wafer 200. Cap wafer 300 may be bonded to MEMS wafer 100 by eutectic bonding between the bonds 202 and bonds 312. As a result of the eutectic bonding process, moveable elements (e.g., MEMS structure 204, 206, and 208) may be located between a polysilicon layer 112 and cap wafer 300. Furthermore, Cap wafer 300 and MEMS wafer 100 are aligned so that cavity 316A, cavity 316B, and bumps 314 are aligned with MEMS structures 204, 206, and 208 respectively. MEMS structures 204 and 208 are disposed in sealed cavities defined by the eutectic bonding. That is, in a top-down view of portions of MEMS device 400 (not shown), at least a portion of the eutectic bonds formed between bonds 202 and 312 form closed loops, sealing MEMS structures 204 and 208 in enclosed cavities. However, certain other bonds 202 and 312 may not form closed loops and be included for electrical connections.

In FIG. 1U, a dielectric layer 402 may be deposited over substrate 302 of cap wafer 300. Dielectric layer 402 may be an oxide or another low-k dielectric, and be deposited using an appropriate method, such as CVD.

In FIG. 1V, portions of dielectric layer 402 and substrate 302 are removed to create openings 404. Openings 404 expose portions of oxide layer 304. The removal of portions of dielectric layer 402 and substrate 302 may be done using for example a combination of photolithography and etching techniques.

FIG. 1W illustrates oxide layer 406 being deposited in openings 404 by any suitable oxidation processes such as CVD or the like. Subsequently, oxide layer 406 is formed on sidewalls of openings 404.

In FIG. 1X, a second etching may be done in openings 404 to remove portions of oxide layer 304. An etching process, such as a reactive ion etch or other dry etch, an anisotropic wet etch, or any other suitable anisotropic etch or patterning process, is performed to remove the bottom portion of oxide layer 406 and portions of oxide layer 304. As a result, the bottom portions of openings 404 are free from oxide while sidewalls of openings 404 are covered by oxide layer 406. Furthermore, certain metal lines 306A in cap wafer 300 may be exposed through openings 404. The exposed metal lines 306A may be the first layer of metal lines in cap wafer 300, and may be referred to as layer M1.

In FIG. 1Y, through substrate vias (TSVs) 408 (sometimes referred to as through-silicon vias or through-vias) are formed in openings 404. The formation of TSVs 408 may include the splputtering of a seed-layer (not shown), metallic plating, and the removal of the seed layer. Alternatively, TSVs 408 may be formed using other suitable techniques for example, using metal sputtering. TSVs 408 may be formed of any suitable metallic material such as copper or aluminum.

In FIG. 1Z, an oxide release layer 410 is formed, encapsulating TSVs 408. Oxide release layer 410 may be substantially similar to and formed in the same manner as oxide release layer 104. It should be noted that oxide release layer 410 may be formed through multiple oxide deposition processes and their corresponding etch-back processes. Oxide release layer 410 may include voids 412 disposed between sidewalls of TSVs 408. Oxide release layer 410 may be used as a protective layer for cap wafer 300 during subsequent process steps (e.g., the etching of carrier wafer 200 illustrated in FIG. 1AA).

In FIG. 1AA, portions of carrier wafer 200 corresponding to MEMS structures 204 and 206 are removed, for example by etching. Corresponding portions of thin polysilicon layer 122 are also removed as part of this process, exposing various oxide release layers underlying MEMS structures 204 and 206. Thus openings 414 are created.

In FIG. 1AB, a highly-selective etching process, such as vapor HF is used to remove oxide release layer 410 and various oxide release layers underlying MEMS structures 204 and 206 in MEMS wafer 100. The etching process releases various membranes of various MEMS devices (i.e., a pressure sensor and a microphone). Furthermore, TSVs 408 are exposed. TSVs 408 provide connection points for connection to MEMS device 400. The inclusion of TSVs 408 may allow for higher chip density of an integrated circuit incorporating MEMS device 400.

FIG. 1AB illustrates a completed MEMS device 400 in accordance with various embodiments. MEMS device 400 includes a pressure sensor 416, a microphone 418, and another device 420. Pressure sensor 416 includes a membrane (i.e., portion of polysilicon layer 112). The membrane is exposed to ambient pressure on one surface (e.g., through opening 414) and sealed pressure on the other surface (e.g., through sealed cavity 320A). The pressure of sealed cavity 320A may be defined by the conditions of the bonding process (e.g., eutectic bonding) between MEMS wafer 100 and cap wafer 300. Therefore, pressure sensor 416 may detect ambient pressure by comparing the pressure difference between opening 414 (ambient pressure) and sealed cavity 320A. Microphone 418 includes moving elements (i.e., MEMS structure 206) and a membrane (i.e., a portion of polysilicon layer 112). The membrane is exposed to ambient pressure on through opening 414. MEMS structures 204 and 206 may function as bottom electrodes for pressure sensor 416 and microphone 418.

Device 420 may be a motion sensor that allows for the detection of motion through the disposition of a proof mass (i.e., MEMS structure 208) over an electrode (i.e., portions of polysilicon layer 112) in a sealed cavity defined by the eutectic bond of cap wafer 300 to MEMS wafer 100. Alternatively, device 420 may be an accelerometer, a gyroscope, or the like. The pressure of the sealed cavity containing device 420 may be selected in accordance with a desired functionality of device 420. For example, the sealed cavity may have a pressure between about 100-700 mbar for an accelerometer, between about $10^{-4}$ mbar to about 10 mbar for a gyroscope, or the like. Thus, using the various formation steps illustrated in FIGS. 1A-1AB, a microphone, a pressure sensor, and another MEMS device may be formed using the same MEMS manufacturing process.

FIGS. 2A-2M illustrate cross-sectional views of various intermediate stages of manufacture of a MEMS device 800 in accordance with second alternative embodiments.

Figure 2A:
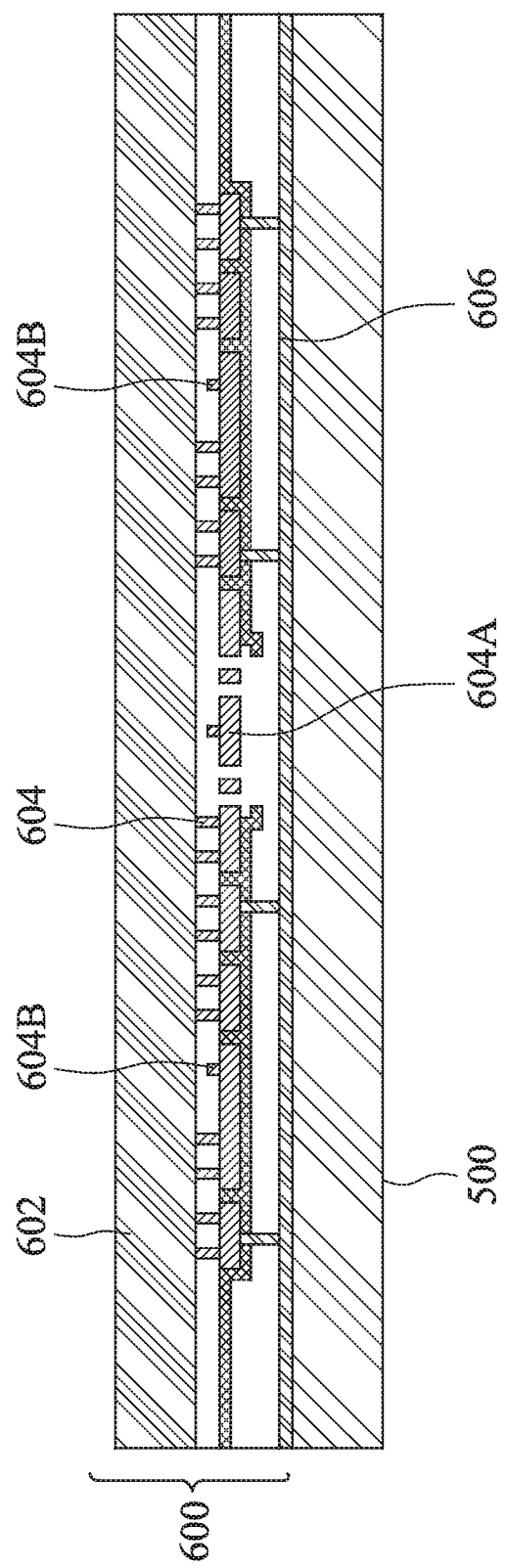
FIGS. 2A-2M are cross-sectional views of intermediate stages of manufacture of a MEMS device in accordance with various alternative embodiments.

In FIG. 2A, a cross-sectional view of a MEMS wafer 600 bonded to a carrier wafer 500. MEMS wafer 600 and carrier wafer 500 may be substantially similar to MEMS wafers 100 and carrier wafer 200 of MEMS device 400. In particular MEMs wafer 600 includes a substrate 602, patterned polysilicon layer 604, and bonding layer 606. Therefore, detailed description of MEMS wafer 600 and carrier wafer 500 are omitted for brevity. However, polysilicon layer 604 may be patterned differently than polysilicon layer 112 of MEMS wafer 100. Notably, portion 604A of polysilicon layer 604 is patterned in accordance with a microphone membrane, and portions 604B are patterned in accordance with other MEMS devices (e.g., a motion sensor, accelerometer, gyroscope, or the like). Unlike polysilicon layer 112 of MEMS wafer 100, polysilicon layer 604 may not include a portion patterned for a membrane of a pressure sensor device. MEMS wafer 600 may be bonded to carrier wafer 500 using known bonding processes such as fusion bonding with a bonding layer 606, which may be a thin polysilicon layer.

Figure 2B:
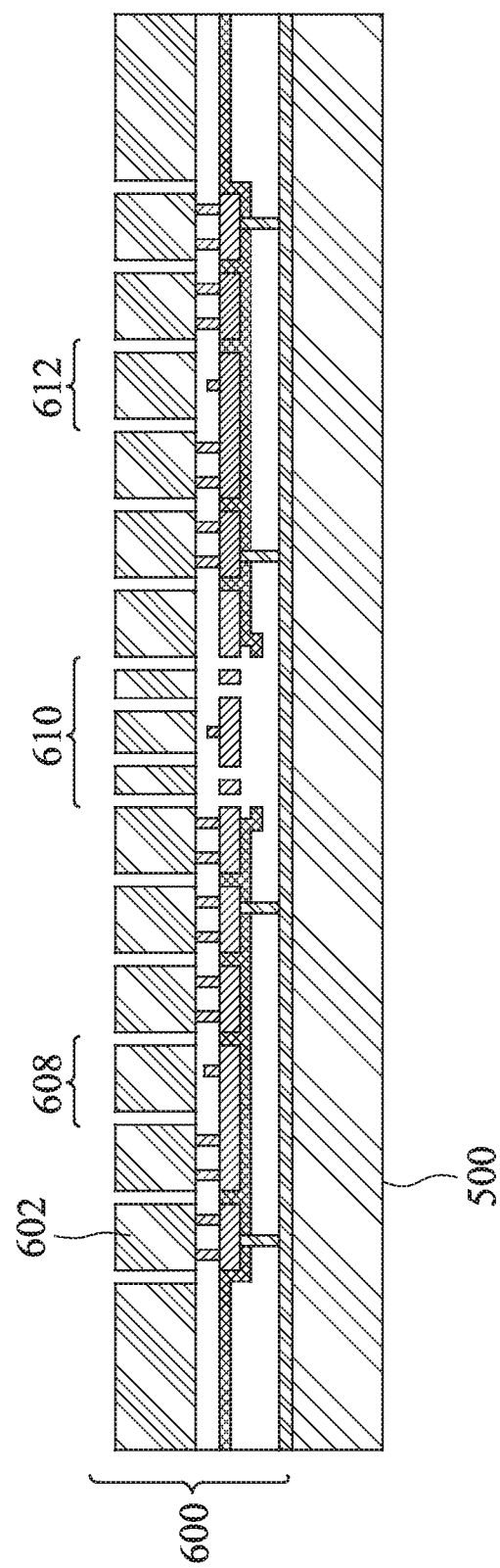

In FIG. 2B, portions of a substrate 602 in MEMS wafer 600 has been patterned. The remaining portions of patterned substrate 602 may form MEMS structures such as structures 608, 610, and 612.

Figure 2C:
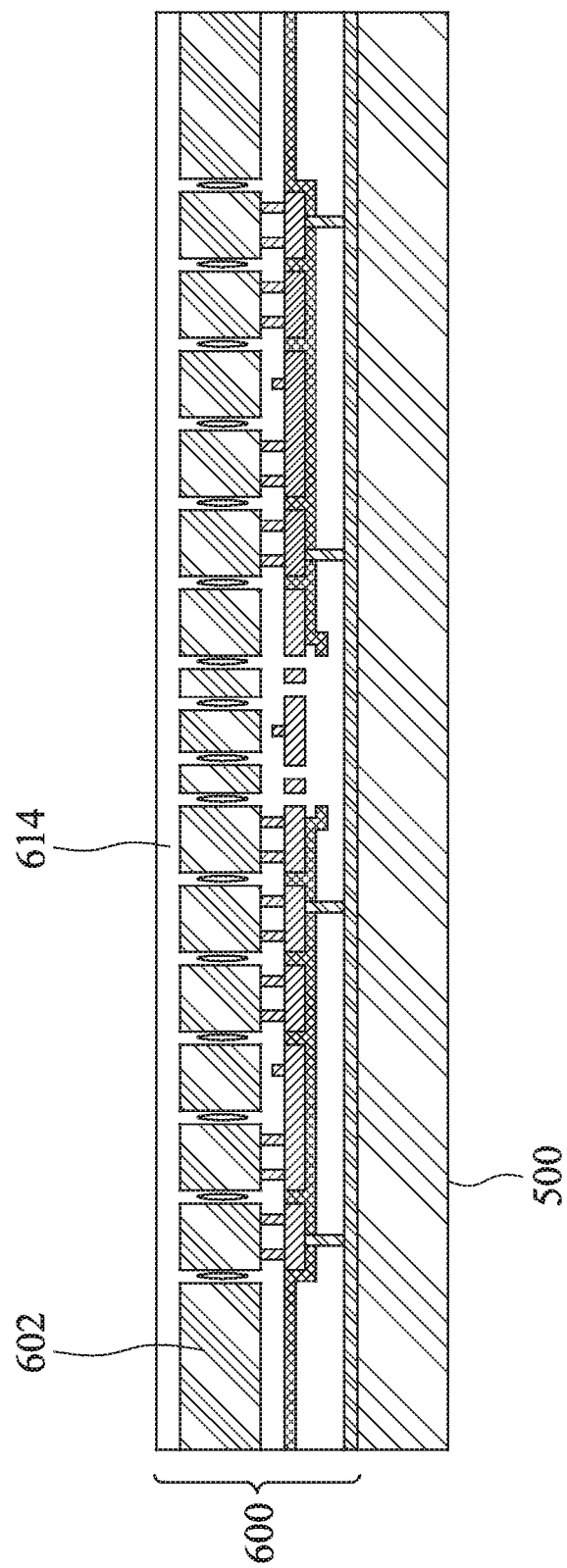

In FIG. 2C, a dielectric layer 614 may be formed and patterned over substrate 602. Dielectric layer 614 may also be referred to as oxide release layer 614 or sacrificial oxide layer 614. Oxide release layer 614 may be formed of a low-k dielectric material, such as silicon dioxide ($SiO_2$). Oxide release layer 614 may be deposited over substrate 602 using, for example CVD. Furthermore, oxide release layer 614 may be formed of a different suitable material such as low-k dielectrics such as carbon doped oxides, extremely low-k dielectrics such as porous carbon doped silicon dioxide, a polymer such as polyimide, combinations thereof, or the like. It should be noted that fourth oxide release layer 614 may be formed through multiple oxide deposition processes and their corresponding etch-back processes. Voids may be embedded in oxide release layer 614 to increase oxide release time during a subsequent selective oxide etching process (e.g., vapor HF).

Figure 2D:
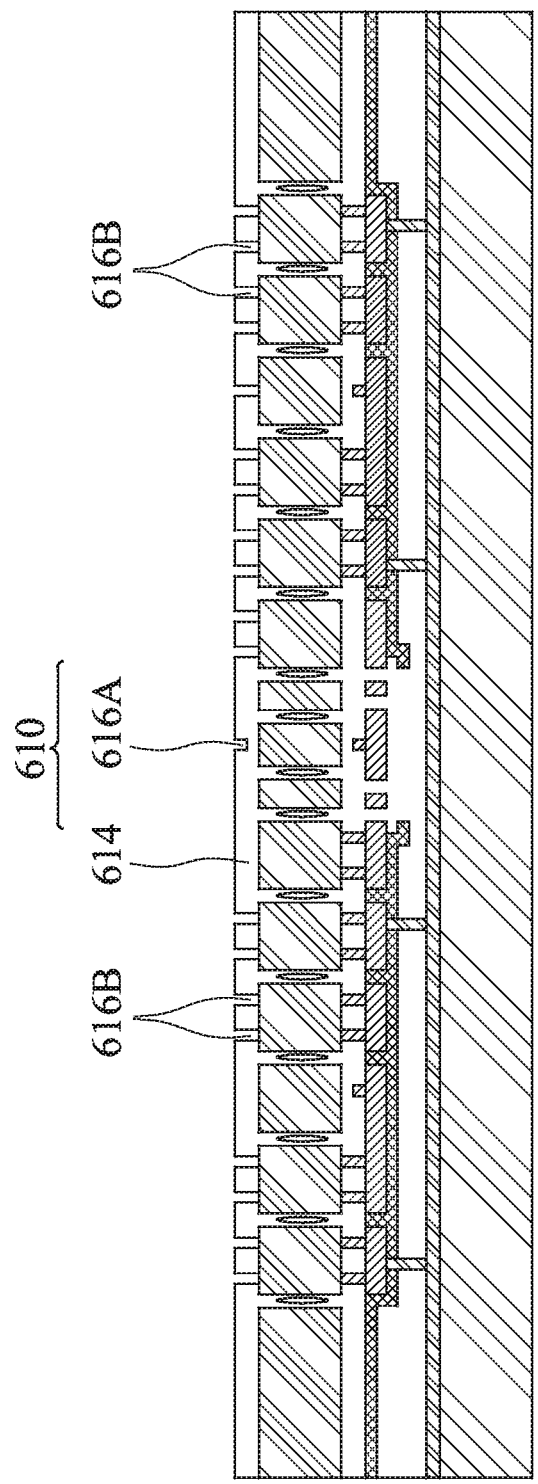

In FIG. 2D, oxide release layer 614 is patterned, creating bump opening 616A and via openings 616B. The patterning of oxide release layer 614 may be done using, for example, a combination of photolithography and etching techniques. Two separate photolithography steps may be performed in order to create bump opening 616A and via openings 616B. For example, a shallow etching may be performed to create bump opening 616A, while a deeper etching may be performed to create via openings 616B. As shown in FIG. 2D, bump opening 616A does not extend to substrate 602 while via openings 616B do extend to and expose portions of substrate 602. Furthermore, bump opening 616A may be aligned with MEMS structure 610.

Figure 2E:
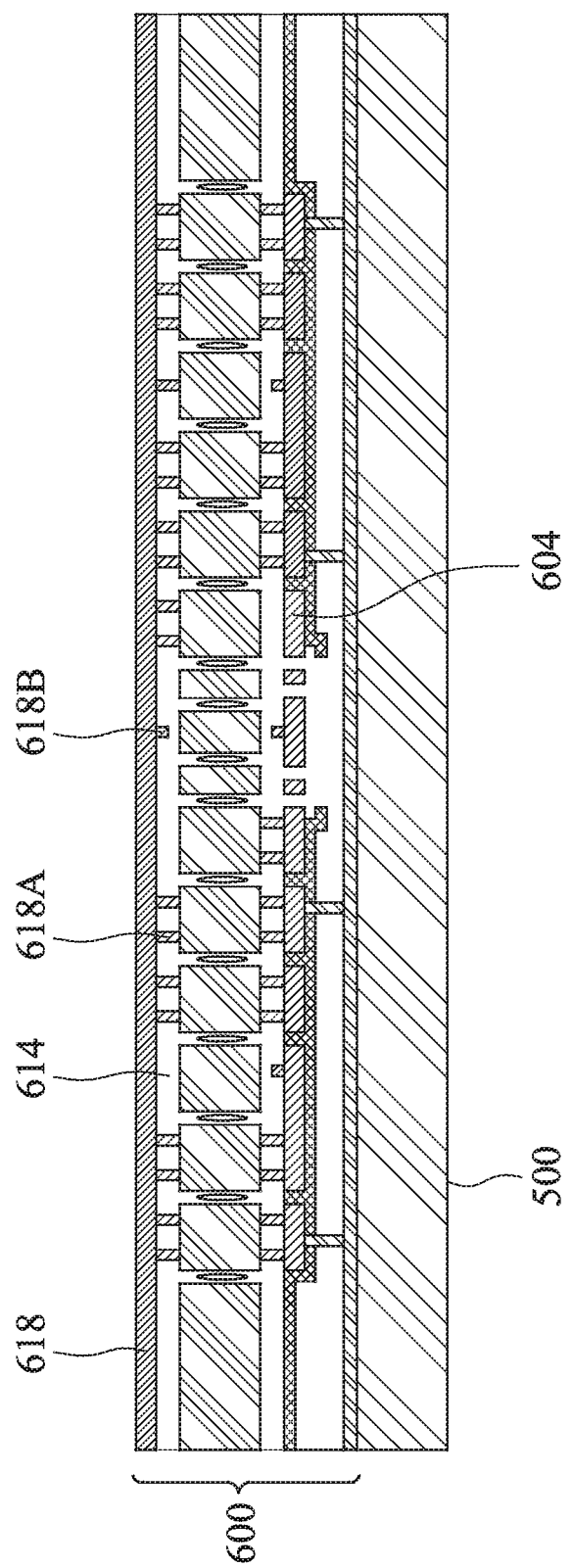

In FIG. 2E, a polysilicon layer 618 is deposited over oxide release layer 614 using, for example, CVD. Polysilicon layer 618 fills via openings 616B and bump opening 616A, forming polysilicon vias 618A and polysilicon bump 618B respectively. Polysilicon layer 618 may be substantially similar to polysilicon layer 604. Polysilicon vias 618A may be formed for electrical routing and may further act as a mechanical structure. For example polysilicon vias 618A may be used as a vapor HF etch stop layer in subsequent process steps. Furthermore, in some embodiments, polysilicon bump 618B may be used as a mechanical bump to limit the motion of moving elements, or an anti-stiction bump.

Figure 2F:
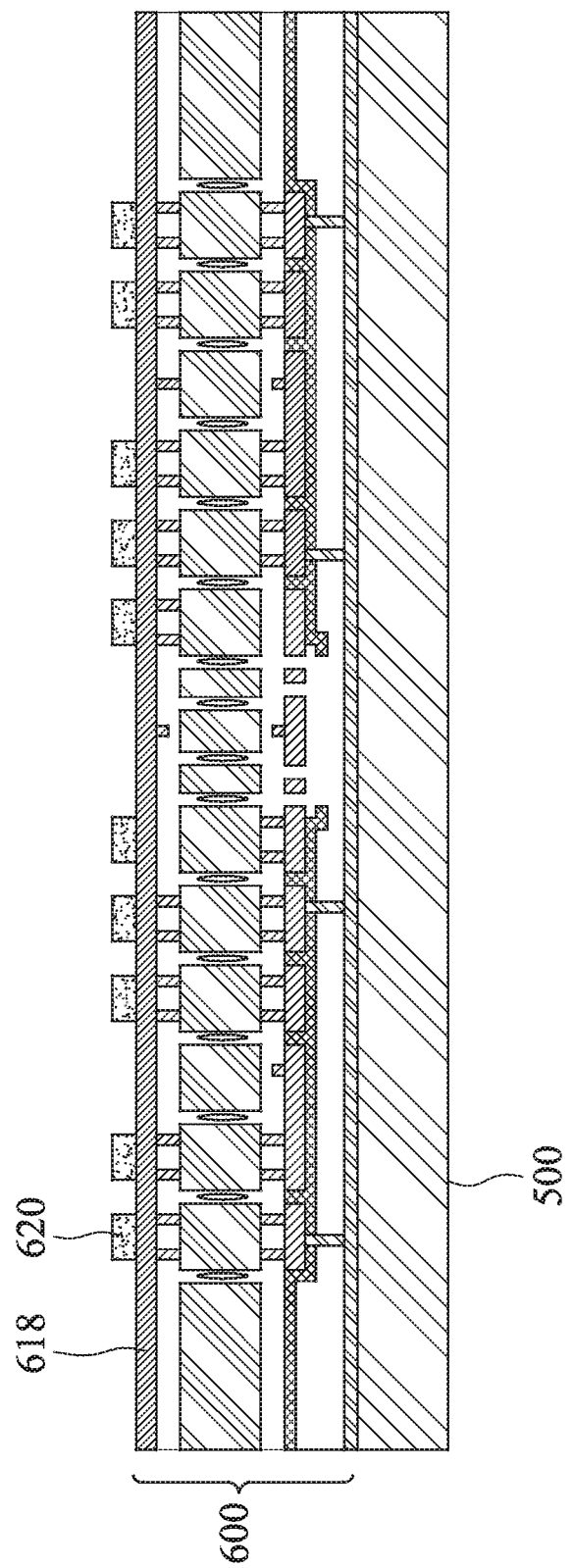
Figure 2G:
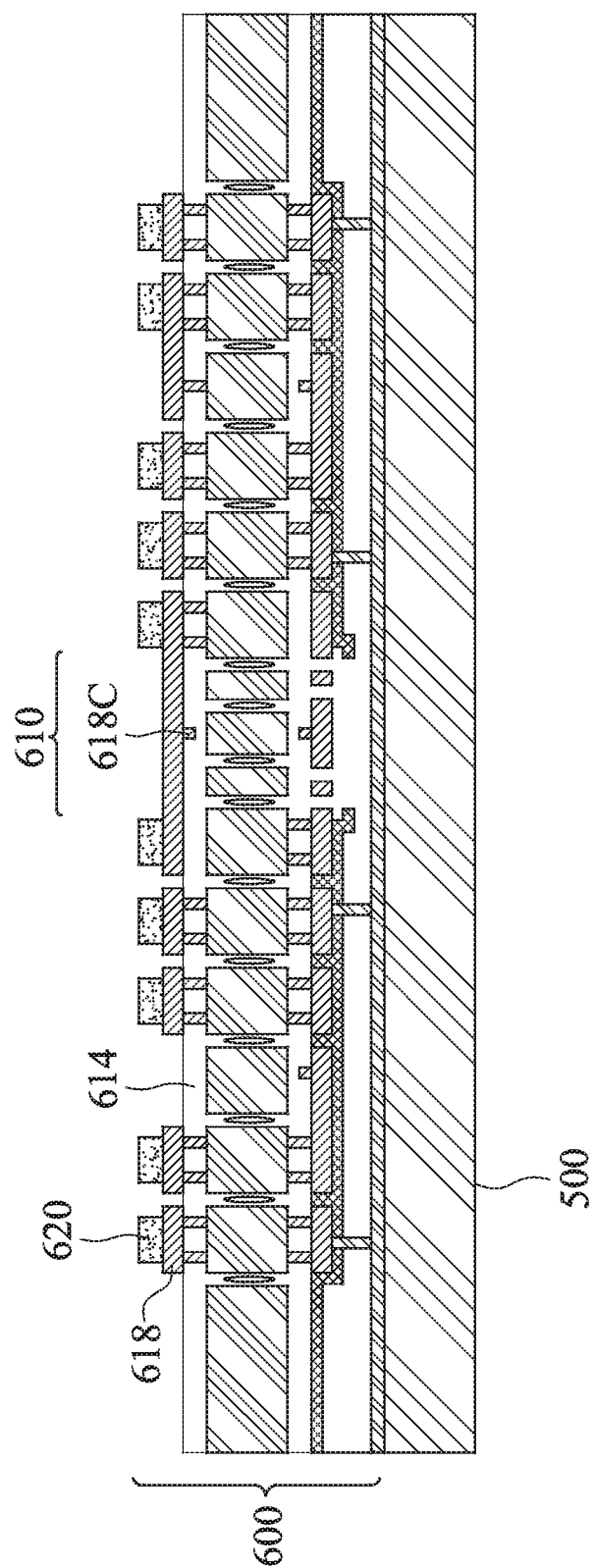

In FIG. 2F, metal bonds 620 are formed over polysilicon layer 618. Bonds 620 may be substantially similar to bonds 202 in MEMS device 400. Therefore, detailed descriptions of these features are omitted for brevity. In FIG. 2G, polysilicon layer 618 is patterned to expose portions of oxide release layer 614. Furthermore, a portion of polysilicon layer 618 corresponding to MEMS structure 610 (i.e., portion 618C) may remain unpatterned and uninterrupted.

Figure 2H:
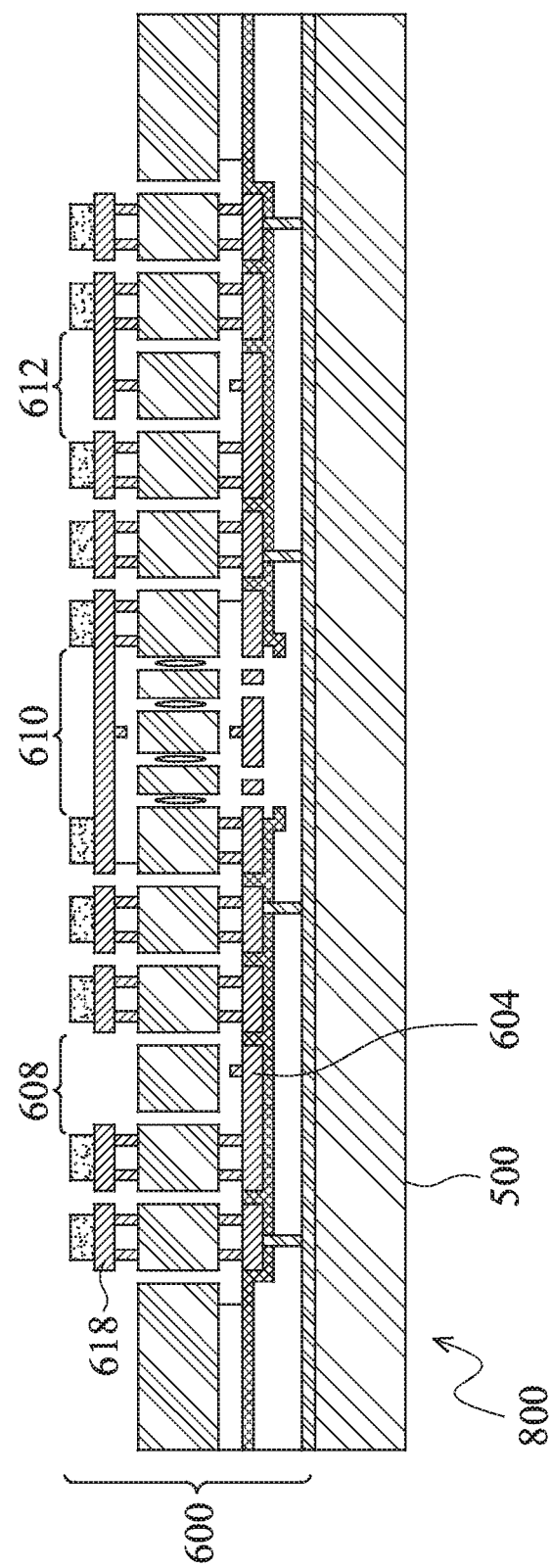

FIG. 2H illustrates the release of the MEMS structures 608 and 612 by a vapor HF etching of portions of oxide release layers 614 and various oxide release layers in MEMS wafer 600. This type of etch process has a high selectivity between oxide release layers and other features in MEMS wafer 600 so that that the other features are not significantly attacked during the removal of portions of the various oxide release layers. Furthermore, polysilicon layers 604 and 618 protects portions of oxide release layers during the etch process, and these protected regions may be referred to as anchor regions. This etch process allows for free movement of the movable elements of MEMS structures 608 and 612 in at least one axis. It should be noted that the oxide release layers to be removed depend on layout design.

Figure 2I:
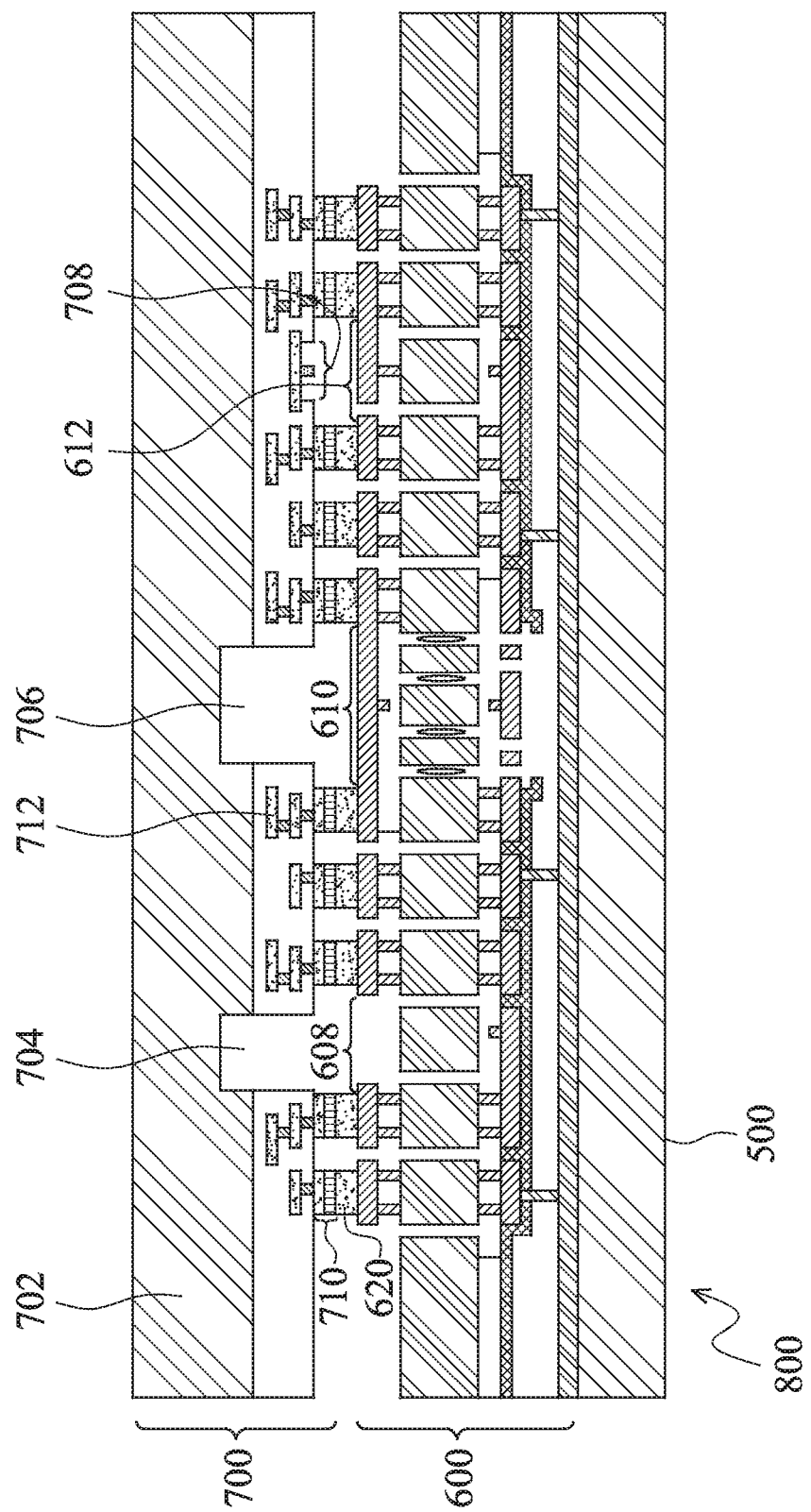

In FIG. 2I, MEMS wafer 600 is bonded to a cap wafer 700, forming a MEMS device 800. Cap wafer 700 may be substantially similar to cap wafer 300 of MEMS device 400. That is, cap wafer 700 includes a substrate 702, cavities 704 and 706, bumps 708, bonds 710, and interconnect structure 712. Therefore, detailed description of cap wafer 700 is omitted for brevity. MEMS wafer 600 may be bonded to cap wafer 700 using an appropriate bonding process, for example eutectic bonding of bonds 710 and 620. MEMS structures 608, 610, and 612 may be aligned with cavity 704, cavity 706, and bumps 708 respectively. As a result of eutectic bonding, MEMS structures 608 and 612 may be disposed in sealed cavities. That is, in a top down view of MEMS device 800 (not shown), certain bonds 710 and 620 may form closed loops. However, certain other bonds 710 and 620 may be used for electrical connection, not to form closed loops.

Figure 2J:
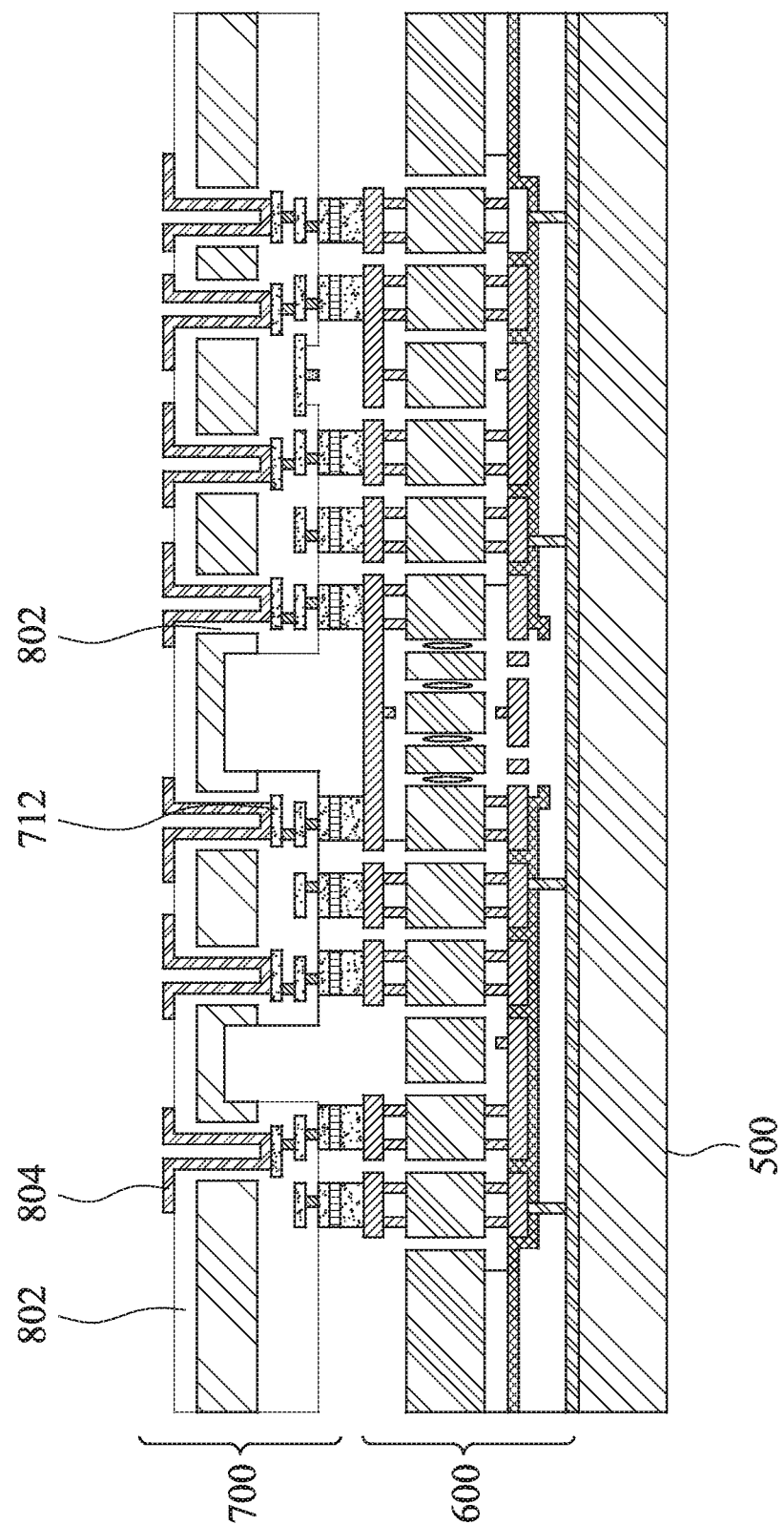

FIG. 2J shows the insertion of dielectric layers 802 and TSVs 804 in cap wafer 700. Dielectric layers 802 and TSVs 804 are substantially similar to and may be formed in substantially the same manner as oxide layers 402 and 406, and TSVs 408 in MEMS device 400. Therefore, detailed description of these features is omitted for brevity. Notably, TSVs 804 are electrically connected to various features in MEMS device 800 through interconnect structure 712.

Figure 2K:
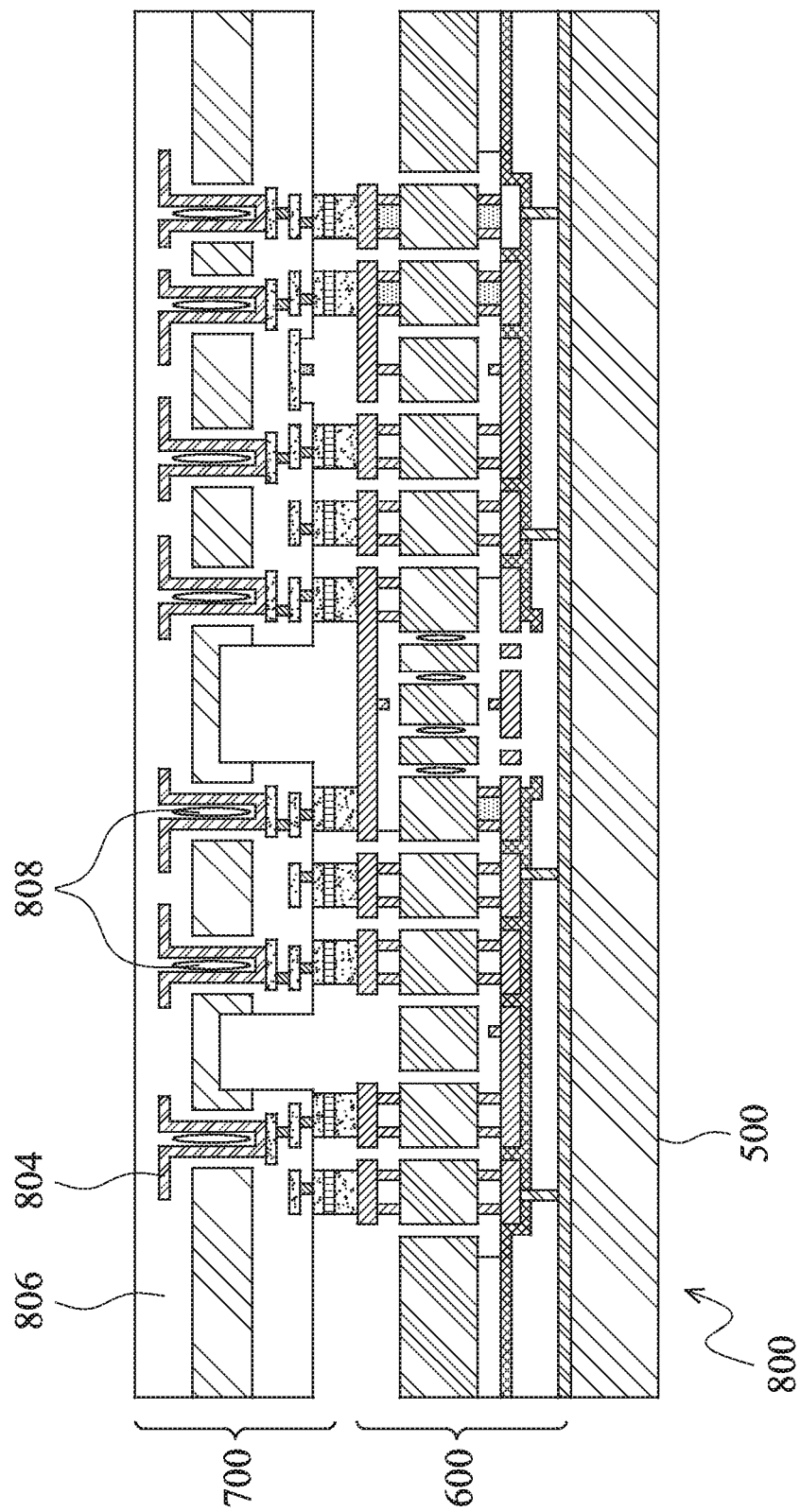

In FIG. 2K, an oxide release layer 806 is formed, encapsulating TSVs 804. Oxide release layer 806 may be substantially similar to and formed in the same manner as oxide release layer 104. It should be noted that oxide release layer 806 may be formed through multiple oxide deposition processes and their corresponding etch-back processes. Oxide release layer 806 may include voids 808 disposed between sidewalls of TSVs 804. Oxide release layer 806 may be used as a protective layer for cap wafer 700 during subsequent process steps (e.g., the etching of carrier wafer 500 illustrated in FIG. 2L).

Figure 2L:
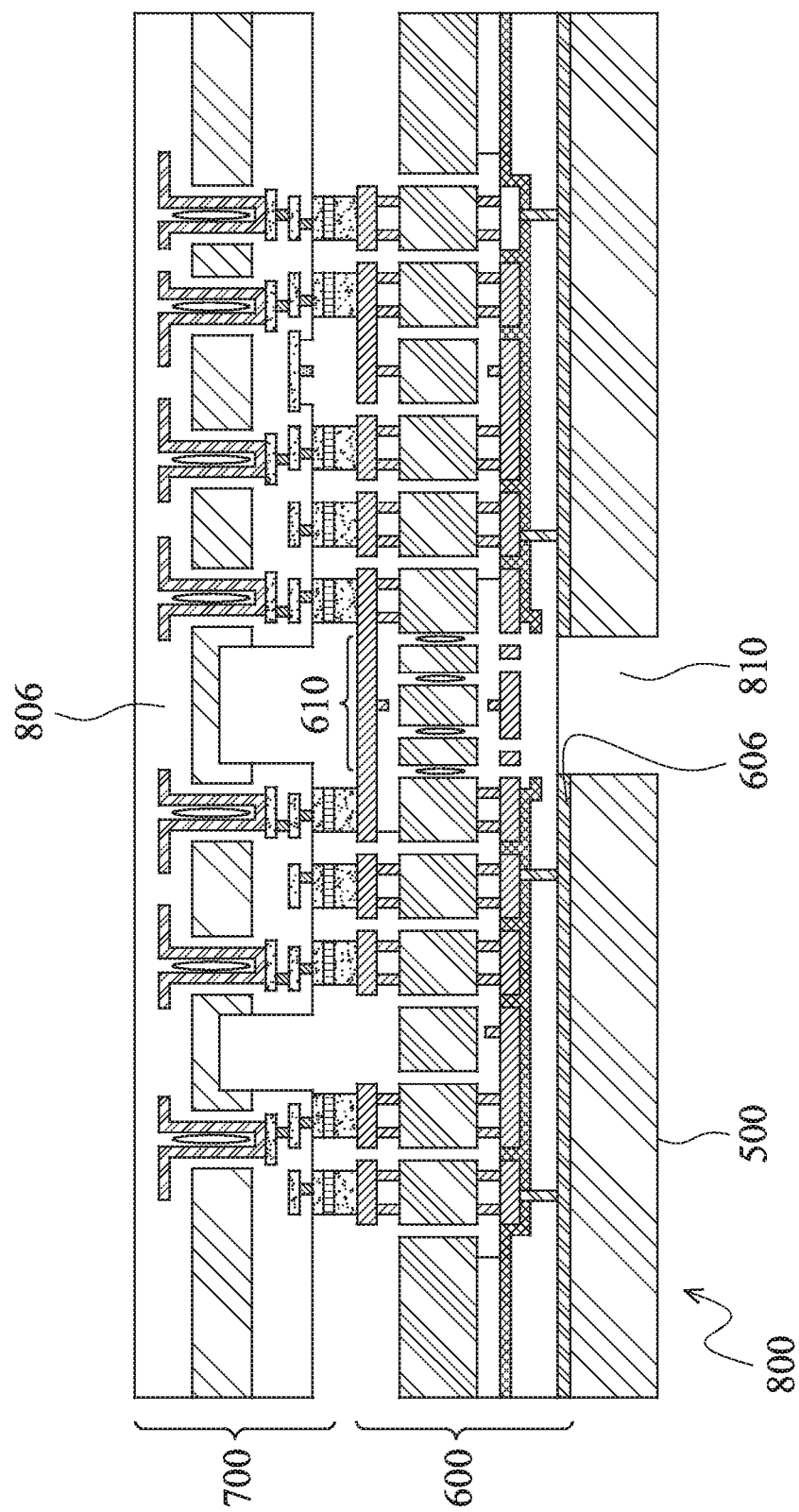

In FIG. 2L, portions of carrier wafer 500 corresponding to MEMS 610 structure is removed, for example by etching. Corresponding portions of bonding layer 606 is also removed as part of this process, exposing various oxide release layers underlying MEMS structure 610. Thus, opening 810 is created.

Figure 2M:
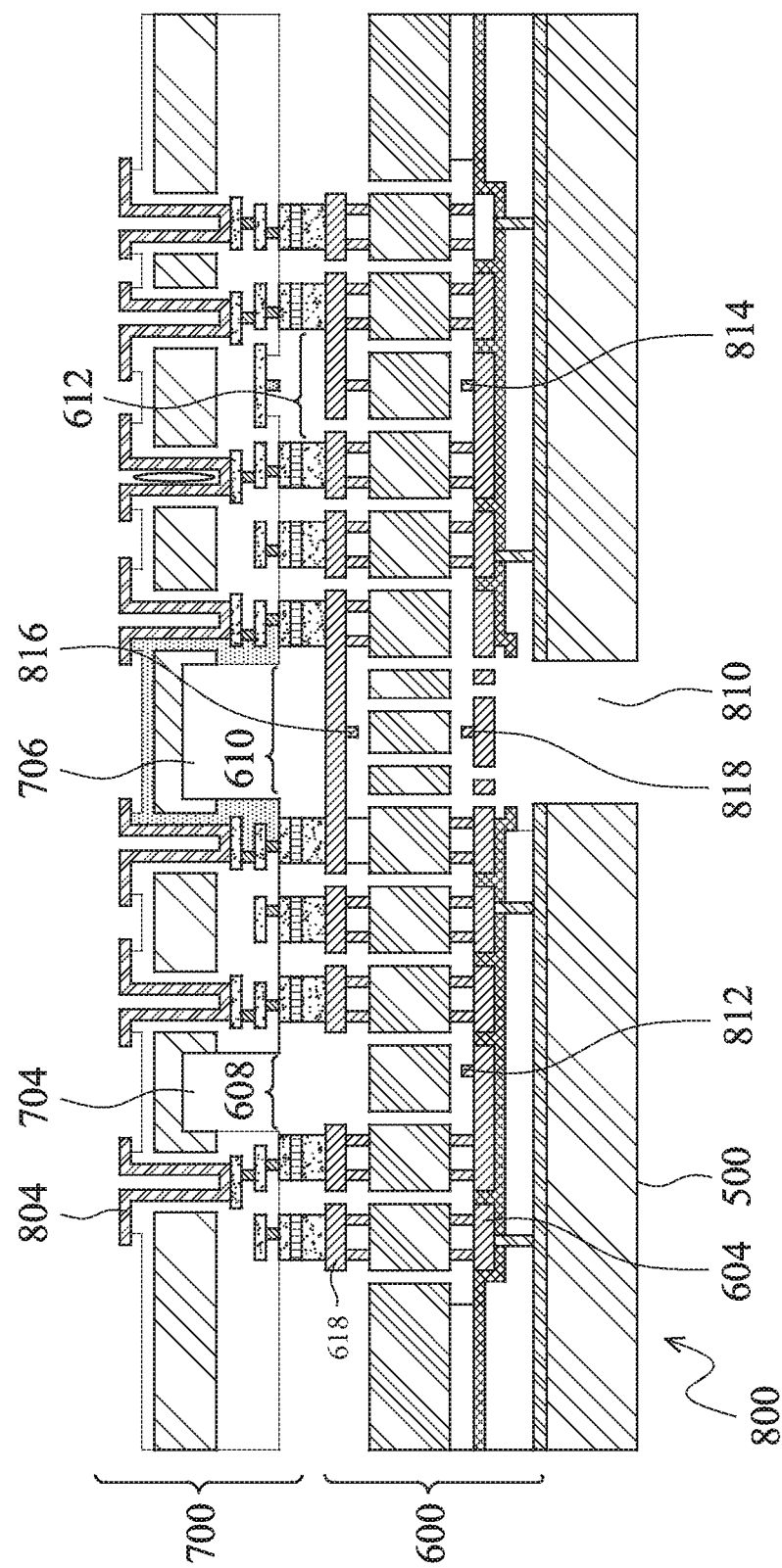

In FIG. 2M, a highly-selective etching process, such as vapor HF is used to remove oxide release layer 806 and various oxide release layers underlying MEMS structure 610 in MEMS wafer 600. The etching process releases various membranes of various MEMS devices (i.e., a pressure sensor and a microphone). Furthermore, TSVs 804 are exposed. TSVs 804 provide connection points for connection to MEMS device 800. The inclusion of TSVs 804 may allow for higher chip density of an integrated circuit incorporating MEMS device 800.

Thus, MEMS device 800 is completed. MEMS device 800 includes devices 812 and 814, pressure sensor 816, and microphone 818. Notably, pressure sensor 816 and microphone 818 are disposed on opposite sides of the same MEMS structure 610.

Devices 812 and 814 may be motion sensors, gyroscopes, accelerometers, or the like disposed in sealed cavities defined by the bonding process of cap wafer 700 to MEMS wafer 600. A pressure level of the sealed cavities as defined by the bonding may be selected in accordance with a desired functionality of devices 812 and 814. Devices 812 and 814 may or may not perform the same function.

Pressure sensor 816 includes a membrane of polysilicon layer portion 618C, which is exposed to ambient pressure on one side (via opening 810) and sealed pressure on the other (via cavity 706). Because polysilicon layer portion 618C is uninterrupted, cavity 706 is sealed and not exposed to ambient pressure. The pressure of cavity 706 may be defined by the eutectic bonding process of MEMS wafer 600 to cap wafer 700. Microphone 818 includes a membrane of a portion of polysilicon layer 604, which is exposed to an ambient environment through opening 810. Thus FIGS. 2A-2M disclose various alternative intermediate stages of manufacture for incorporating the manufacture of a MEMS pressure sensor device, a MEMS microphone, and other MEMS devices in the same process.

In accordance with an embodiment, a micro-electromechanical (MEMS) device includes a mems chip including a first conductive layer having a first membrane for a microphone device, a first MEMS structure and a second MEMS structure over the first conductive layer, and a second conductive layer including a second membrane for a pressure sensor device. The first MEMS structure is disposed over the first membrane and the second membrane is disposed over the first MEMS structure. The MEMS device also includes a carrier chip bonded to the MEMS chip. The carrier chip includes a cavity exposed to an ambient environment. The cavity includes the first membrane and a first surface of the second membrane. The MEMS device further includes a cap chip bonded to a surface of the MEMS chip opposing the carrier chip. The cap chip and the MEMS chip define a second sealed cavity and a third sealed cavity. The second MEMS structure is disposed in the second sealed cavity, and a second surface of the second membrane is exposed to a sealed pressure level of the third sealed cavity.

In accordance with an embodiment, a package includes a device chip. The device chip includes a first conductive layer including a first membrane for a first device, a first micro-electromechanical (MEMS) structure over and aligned with the first membrane, and a second conductive layer including a second membrane for a second device different than the first device. The second membrane is disposed over and aligned with the first mems structure, and opposing surfaces of the second membrane are exposed to different pressure levels. The package further includes a cap bonded to the device chip. The cap includes a substrate, interconnect structures disposed between the substrate and the device chip, and through-vias extending through the substrate and electrically connected to the interconnect structures.

In accordance with an embodiment, a device includes a device chip including a conductive layer providing a first membrane for a first device and a second membrane for a second device different than the first device, a first micro-electromechanical (MEMS) structure over and aligned with the first membrane, and a second MEMS structure over and aligned with the second membrane. The device also includes a carrier bonded to the device chip, wherein the carrier exposes a first surface of the first membrane and a second surface of the second membrane to ambient pressure. The device also includes a cap bonded to an opposing surface of the device chip as the carrier. The cap includes a through via extending through a substrate. The cap and the device chip define a first sealed cavity extending into the substrate. The first MEMS structure and a third surface of the first membrane are disposed in the first sealed cavity. The cap also includes a second sealed cavity extending into the substrate. The second MEMS structure and a fourth surface of the second membrane are disposed in the second sealed cavity.

Although the present embodiments and their advantages have been described in detail, it should be understood that various changes, substitutions and alterations can be made herein without departing from the spirit and scope of the disclosure as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
  a device chip comprising:
    a conductive layer providing a first membrane for a first device and a second membrane for a second device different than the first device;
    a first micro-electromechanical (MEMS) structure over and aligned with the first membrane; and
    a second MEMS structure over and aligned with the second membrane; a
  a carrier bonded to the device chip, wherein the carrier exposes a first surface of the first membrane and a second surface of the second membrane to ambient pressure; and
  a cap bonded to the device chip, the device chip being interposed between the cap and the carrier, wherein the cap comprises a through via extending through a substrate, and wherein the cap and the device chip define:
    a first cavity extending into the substrate, wherein the first MEMS structure and a third surface of the first membrane are disposed in the first cavity; and
    a second cavity extending into the substrate, wherein the second MEMS structure and a fourth surface of the second membrane are disposed in the second cavity, and wherein the first cavity is completely separated from the second cavity.

2. The device of claim 1, wherein the cap further comprises an interconnect structure disposed between the substrate and the device chip, wherein the through via is electrically connected to the interconnect structure.

3. The device of claim 1, wherein the conductive layer further provides a third membrane for a third device different than the first device and the second device, wherein the device chip further comprises a third MEMS structure over and aligned with the third membrane, wherein the cap and the device chip further define a third cavity, and wherein the third MEMS structure and a fifth surface of the third membrane are disposed in the third cavity.

4. The device of claim 3, wherein the cap further comprises anti-stiction bumps in the third cavity.

5. The device of claim 1, wherein a first pressure level in the first cavity is the same as a second pressure level of the second cavity.

6. The device of claim 1, wherein the carrier comprises:
  a first through hole exposing the first surface of the first membrane to ambient pressure; and
  a second through hole exposing the second surface of the second membrane to ambient pressure.

7. A device comprising:
  a first chip comprising a conductive layer, wherein the conductive layer provides a first membrane for a first device and a second membrane for a second device different than the first device;
  a second chip bonded to a first side of the first chip by a plurality of eutectic bonds, the second chip comprising:
    a substrate, wherein a top surface of the first membrane is exposed to a pressure level of a first cavity extending into the substrate, and wherein a top surface of the second membrane is exposed to a pressure level of a second cavity extending into the substrate, the first cavity being sealed off from the second cavity by the eutectic bonds; and
    a plurality of through vias extending through the substrate; and a third chip bonded to a second side of the first chip, the second side being opposite the first side, wherein a first opening extending through the third chip exposes a bottom surface of the first membrane to an ambient pressure level.

8. The device of claim 7, wherein a second opening extending through the third chip exposes a bottom surface of the second membrane to the ambient pressure level.

9. The device of claim 7 further comprising a third device having a first micro-electromechanical (MEMS) structure disposed in a third cavity, the third cavity being sealed off from the first cavity and the second cavity by the eutectic bonds.

10. The device of claim 9, wherein the third device is a motion sensor, a gyroscope, or an accelerometer.

11. The device of claim 7, wherein the first device further comprises a first micro-electromechanical (MEMS) structure disposed in the first cavity, and wherein the second device further comprises a second MEMS structure disposed in the second cavity.

12. The device of claim 7, wherein the plurality of through vias is electrically connected to the plurality of eutectic bonds.

13. The device of claim 7, wherein the first device is a microphone, and wherein the second device is a pressure sensor.

14. The device of claim 7, wherein the second chip comprises an oxide layer disposed between each of the plurality of through vias and the substrate.

15. A device comprising:
a first chip comprising a conductive layer that provides a first membrane for a first device and a second membrane for a second device;
a second chip bonded the first chip, the second chip comprising:
a semiconductor substrate;
an insulating layer on the semiconductor substrate; and
a plurality of through vias extending through the semiconductor substrate, the insulating layer disposed between the plurality of through vias and the semiconductor substrate along a line perpendicular to a major surface of the semiconductor substrate; and
a third chip bonded to the first chip, the first chip being interposed between the third chip and the second chip, wherein a first opening extending through the third chip exposes a first surface of the first membrane to an ambient pressure level, and wherein a second opening extending through the third chip exposes a second surface of the second membrane to the ambient pressure level.

16. The device of claim 15 wherein the first chip and the second chip define a first cavity, and wherein a third surface of the first membrane is exposed to a pressure level of the first cavity.

17. The device of claim 16, wherein the first cavity extends into the semiconductor substrate.

18. The device of claim 15, wherein the first chip and the second chip define a first cavity, wherein a third surface of the first membrane is exposed to a pressure level of the first cavity, wherein the first chip and the second chip define a second cavity, wherein a fourth surface of the second membrane is exposed to a pressure level of the second cavity, and wherein the pressure level of the second cavity is equal to the pressure level of the first cavity.

19. The device of claim 18, wherein the second chip is bonded to the first chip by a plurality of eutectic bonds, and wherein the first cavity is sealed off from the second cavity by the plurality of eutectic bonds.

20. The device of claim 19, wherein the plurality of through vias are electrically connected to the plurality of eutectic bonds.

* * * * *